(12) United States Patent
Johnston et al.

(10) Patent No.: US 10,354,668 B2
(45) Date of Patent: Jul. 16, 2019

(54) SYSTEM AND METHOD FOR PROCESSING AUDIO DATA

(71) Applicant: IMMERSION SERVICES LLC, Renton, WA (US)

(72) Inventors: James David Johnston, Redmond, WA (US); Stephen Daniel White, Woodinville, WA (US); King Wei Hor, Redmond, WA (US); Barry M. Genova, Bothell, WA (US)

(73) Assignee: IMMERSION NETWORKS, INC., Renton, WA (US)

( * ) Notice: Subject to any disclaimer, the term of this patent is extended or adjusted under 35 U.S.C. 154(b) by 0 days.

(21) Appl. No.: 15/786,451

(22) Filed: Oct. 17, 2017

(65) Prior Publication Data
US 2018/0277130 A1    Sep. 27, 2018

Related U.S. Application Data

(60) Provisional application No. 62/475,186, filed on Mar. 22, 2017.

(51) Int. Cl.
*H04B 3/21* (2006.01)
*G10L 19/16* (2013.01)
(Continued)

(52) U.S. Cl.
CPC ........ *G10L 19/167* (2013.01); *G10L 19/0017* (2013.01); *G10L 19/0204* (2013.01);
(Continued)

(58) Field of Classification Search
CPC .... G10L 19/167; H04N 19/45; H04N 19/625; H04B 3/20; H04B 1/667
See application file for complete search history.

(56) References Cited

U.S. PATENT DOCUMENTS

| 5,581,654 A | 12/1996 | Tsutsui | |
|---|---|---|---|
| 2001/0006553 A1* | 7/2001 | Osakabe | .......... H04L 29/06027 381/80 |

(Continued)

FOREIGN PATENT DOCUMENTS

WO    03/088212    10/2003

OTHER PUBLICATIONS

Notification of Transmittal of International Search Report and Written Opinion of the International Searching Authority for International Application No. PCT/US2018/021530 dated Jul. 13, 2018 by the European Patent Office, 23 pages.

(Continued)

*Primary Examiner* — Kenneth T Lam
(74) *Attorney, Agent, or Firm* — Jackson Walker LLP; Christopher J. Rourk; Thomas B. Hayes

(57) ABSTRACT

A codec operable to process audio data and related data. The codec further operable to receive at least one of an audio, audio auxiliary, program configuration, and data signals from a program source, the audio signals including at least one of single channel audio and multi-channel audio signals, audio auxiliary signals including spatial and motion data and environmental characteristics, the data signals including program related data. The codec further operable to generate a non-transitory encoded bitstream, wherein the bitstream includes at least one of synchronization command data and at least one of a program command data, audio channel data, audio auxiliary data, program content data, and an end of stream data, wherein the encoded bitstream includes an identifier for defining packet type for each data component. The synchronization command data includes a stream start flag defining an entry point for decoding the bitstream and further provides sample rate for the encoded bitstream.

21 Claims, 11 Drawing Sheets

(51) Int. Cl.

| | |
|---|---|
| *H04N 19/625* | (2014.01) |
| *H04N 19/44* | (2014.01) |
| *H04B 1/66* | (2006.01) |
| *H04B 3/20* | (2006.01) |
| *G10L 19/02* | (2013.01) |
| *H04L 29/06* | (2006.01) |
| *H04N 21/233* | (2011.01) |
| *H03H 17/02* | (2006.01) |
| *G10L 19/025* | (2013.01) |
| *G10L 19/00* | (2013.01) |
| *G10L 19/032* | (2013.01) |
| *G10L 19/008* | (2013.01) |

(52) U.S. Cl.
CPC .......... *G10L 19/025* (2013.01); *G10L 19/032* (2013.01); *H03H 17/0272* (2013.01); *H04B 1/667* (2013.01); *H04B 3/20* (2013.01); *H04B 3/21* (2013.01); *H04L 65/601* (2013.01); *H04L 65/607* (2013.01); *H04N 19/45* (2014.11); *H04N 19/625* (2014.11); *H04N 21/233* (2013.01); *G10L 19/008* (2013.01); *G10L 19/0212* (2013.01)

(56) References Cited

U.S. PATENT DOCUMENTS

| | | | |
|---|---|---|---|
| 2003/0115052 A1 | 6/2003 | Chen et al. | |
| 2003/0125933 A1* | 7/2003 | Saunders | G09B 5/04 704/201 |
| 2009/0055196 A1* | 2/2009 | Oh | G10L 19/008 704/500 |
| 2010/0169104 A1* | 7/2010 | Ekstrand | G10L 19/0208 704/500 |
| 2010/0228557 A1* | 9/2010 | Chen | G10L 19/24 704/500 |
| 2012/0033816 A1* | 2/2012 | Lee | G10L 19/008 381/1 |
| 2014/0112482 A1* | 4/2014 | Virette | G10L 19/008 381/23 |
| 2014/0358554 A1* | 12/2014 | Riedmiller | G10L 19/167 704/500 |
| 2015/0154965 A1* | 6/2015 | Wuebbolt | G10L 19/008 704/500 |
| 2015/0325243 A1* | 11/2015 | Grant | G10L 19/167 704/229 |
| 2016/0012825 A1* | 1/2016 | Kjoerling | G10L 19/008 381/22 |

OTHER PUBLICATIONS

Moriya, et al., "A Design of Lossy and Lossless Scalable Audio Coding", 2000 IEEE International Conference, pp. 889-892.

Jin, et al., "Perceptually Layered Scalable Codec", Oct. 1, 2006, IEEE International Conference, pp. 2125-2129.

Response to the Written Opinion of the International Searching Authority—European Patent Office—and Demand filed in the USPTO dated Jan. 22, 2019 in co-pending International Application No. PCT/US2018/021530, 16 pages.

Notification of Transmittal of the International Search Report and Written Opinion of the International Searching Authority—European Patent Office—dated Apr. 4, 2019 for International Application No. PCT/US2018/021530, 31 pages.

Draft text of ISO/IEC 13818-1:201x 6th edition—"Series H: Audio-visual and Multimedia Systems—Information technology—Generic coding of moving pictures and associated audio information: Systems", International Telecommunication Union, MPEG Meeting, Oct. 21, 2016, 296 pages.

Max Neuendorf, et al., "Information technology—High efficiency coding and media delivery in heterogeneous environments—Part 3: 3D audio", Updated to Proposed 2nd Edition of ISO/IEC 23008-3, MPEG Meeting, Jan. 12, 2017, 798 pages.

Fug, Simone, et al., "Design, Coding and Processing of Metadata for Object-Based Interactive Audio", AES Convention 137, Oct. 2014, 12 pages.

\* cited by examiner

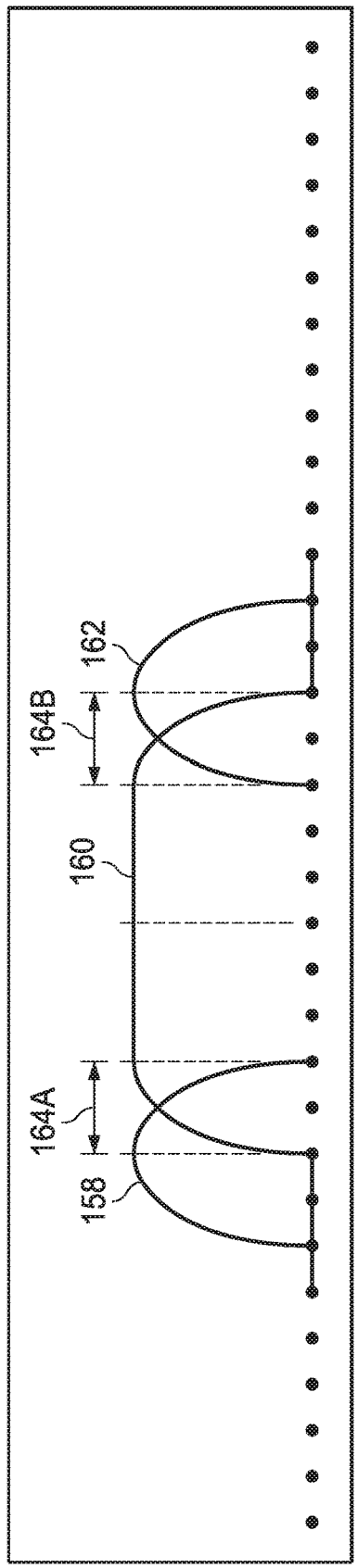
FIG. 10
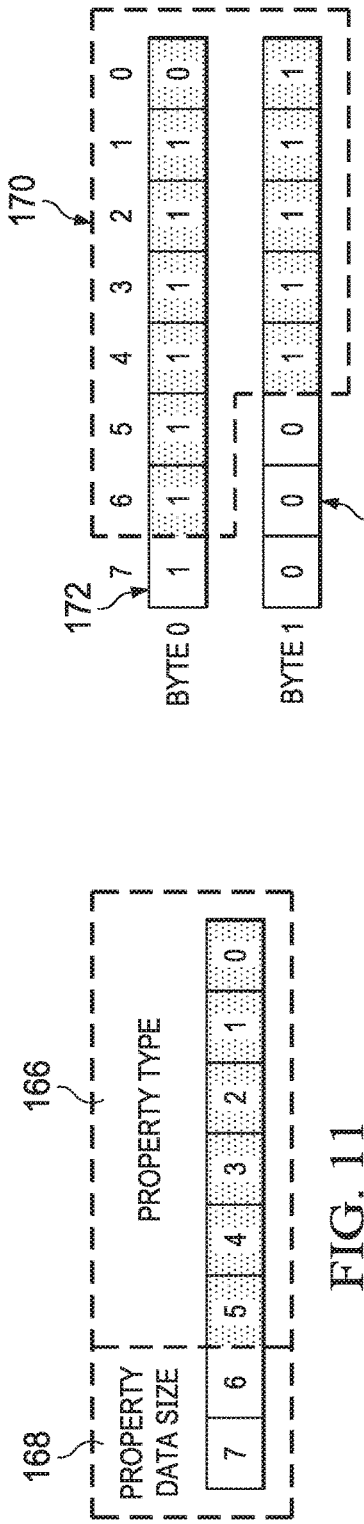
FIG. 11
FIG. 12

SYSTEM AND METHOD FOR PROCESSING AUDIO DATA

RELATED APPLICATIONS

The present application claims benefit of U.S. Provisional Patent Application No. 62/475,186, filed Mar. 22, 2017, entitled "Time/Frequency Hybrid Audio Coding," which is hereby incorporated by reference for all purposes as if set forth herein in its entirety.

TECHNICAL FIELD

The present disclosure relates generally to codecs and digital data formats and, in particular, to hybrid forms of encoding and decoding digital audio.

BACKGROUND

As the use of IP based multi-media becomes more prominent as an alternative to traditional broadcast services, the need for applications to be more dynamic, robust, and of quality exists. As an example, encoding digital audio for transmission or storage can introduce unwanted artifacts that when decoded and rendered can affect sound quality. An example artifact is called pre-echo. Pre-echo is an audio codec artifact where an echo of a sound can be heard in the decoded signal before the actual sound. Pre-echo can be caused by quantization and other inaccuracies that can occur when converting from time domain to frequency domain and then back to time domain, such as using an MDCT to transform a time domain signal into frequency domain and then using an Inverse MDCT to transform back to time domain. The effect is due to the spreading of the error across the block size of the transform, causing both leading and trailing echoing of the audio content. The effect is especially noticeable in audio with sharp impulses and transient signals, such as percussive instruments e.g., castanets. Existing codec technology fails to effectively control or eliminate these artifacts at desired bit rates. In addition, media distribution has already begun to shift from traditional network broadcast services, i.e. dedicated, controlled, and expensive, to an IP network based distribution, which is not dedicated, controlled, and expensive, but rather distributed, dynamic, less expensive, and that does not require fixed bit rates. However, due to inherent latencies and quality of service issues in the distributed network, streaming services have not fully evolved. But as they do evolve, how content is distributed and managed also needs to evolve.

SUMMARY

Techniques herein provide a computer-implemented system and method to encode sampled audio signals by encoding and decoding the sampled audio signals, identifying potential pre-echo events in the encoded audio samples, generating an error signal from the sampled audio signals and decoded sampled audio signals, and encoding data generated from processing potential pre-echo events and the error signal into a bitstream along with the encoded sampled audio signals so that the error signal can be recreated and the potential pre-echo event can be removed when decoded downstream.

In one aspect, an encoder for processing audio data is provided. The encoder includes a computer-usable non-transitory storage resource and one or more processors communicatively coupled to the storage resource, wherein the processors are configured to execute application code instructions that are stored in the storage resource. The encoder can filter sampled audio signals into a plurality of frequency band components and generate quantized digital components for each band of the plurality of bands by pulse code modulating the frequency band components. The encoder can identify and mark a potential for pre-echo events within the generated quantized digital components and further generate an approximate signal of the filtered audio samples by decoding the quantized digital components using inverse pulse code modulation. The encoder then can generate an error signal by comparing the approximate signal with the sampled audio signal and process the error signal and quantized digital components.

In another aspect, the encoder processes the error signal and quantized digital components by processing delayed audio signals and Q band values of the quantized digital components, determining the potential for pre-echo events from the Q band values, and determining scale factors and MDCT block sizes for the error signal using delayed audio signals and Q band values. The MDCT block sizes are determined based on the magnitude of a Q band value and the band that contained the Q band value. The scale factors are determined based on the MDCT block sizes and delayed audio signals. The error signal can be transformed into higher resolution frequency components using the MDCT block sizes. The scale factors and frequency components are quantized and the quantized lines, block sizes, and quantized scale factors are encoded for inclusion in the bitstream.

In another aspect, the encoder can filter sampled audio signals by filtering the audio samples into a plurality of frequency band components using at least one Pseudo-Quadrature Mirror Filter (PQMF). The encoder can generate quantized digital components by modulating the plurality of frequency band components into a plurality of quantized band values using a pulse code modulation technique. The encoder can decode the plurality of quantized band values into an approximate signal using an inverse pulse code modulation technique and at least one Inverse Pseudo-Quadrature Mirror Filter (IPQMF). The encoder can detect pre-echo events adjacent to audio bearing data in the plurality of quantized band values.

In yet another aspect, the encoder can filter sampled audio signals into a plurality of frequency band components using a Pseudo-Quadrature Mirror Filter (PQMF) bank. The encoder can also generate the quantized digital components using Adaptive Pulse Code Modulation (APCM). The encoder can also generate the quantized digital components using Adaptive Differential Pulse Code Modulation (AD-PCM).

In one other aspect, the encoder can identify pre-echo events from the generated quantized digital components by using a timing information relevant to audio data and PQMF output thresholds. The encoder also encodes the transformed and quantized error signal and quantized scale factors.

BRIEF DESCRIPTION OF DRAWINGS

FIG. 10 is a data block depicting three MDCTs having block lengths of 2, 8, and 2, in accordance with certain example embodiments.

FIG. 11 is a data byte depicting encoded property values of a bitstream, in accordance with certain example embodiments.

FIG. 12 is an example of storing an unsigned integer value in a variable number of bytes, in accordance with certain example embodiments.

DETAILED DESCRIPTION OF THE EXAMPLE EMBODIMENTS

Figure 1A:
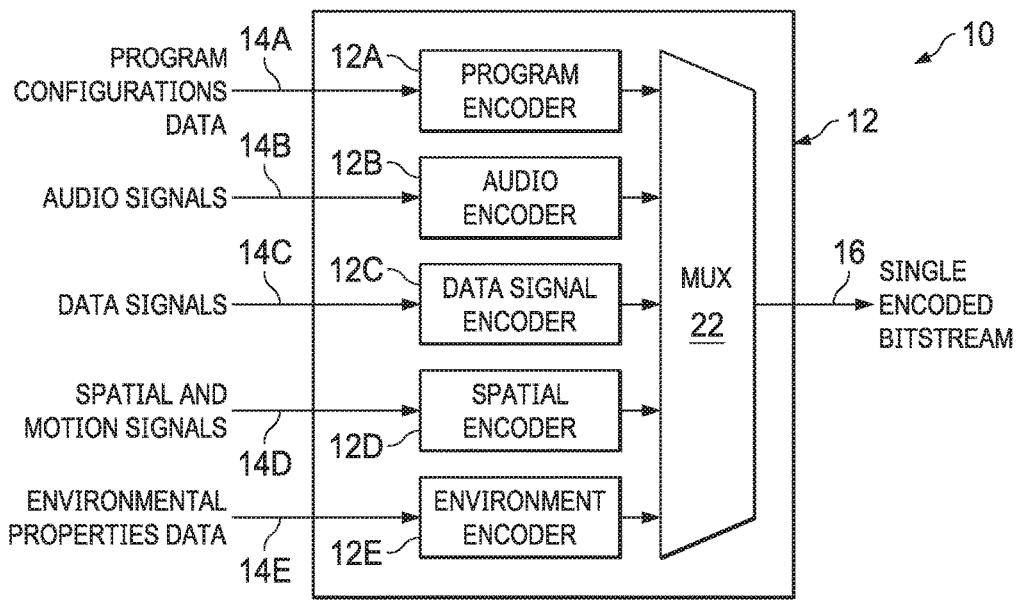
FIG. 1A is a block diagram depicting an encoder, in accordance with certain example embodiments.

The example embodiments presented herein are directed to systems, methods, and computer program products for encoding input signals to bitstream packet data, and decoding from bitstream packet data in a perceptually lossless or near perceptually lossless manner and providing structure and content of the packetized bitstream that can be more effective at rendering program data.

Referring now to the drawings, in which like numerals represent like (but not necessarily identical) elements in the different figures, example embodiments are described in detail.

Figure 1B:
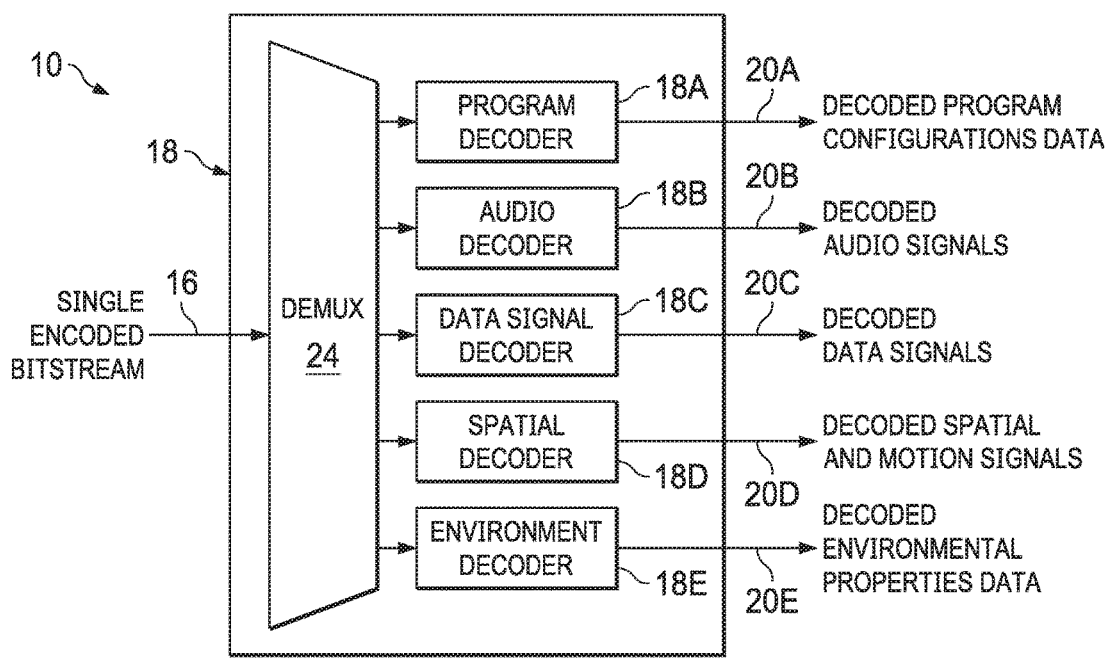
FIG. 1B is a block diagram depicting a decoder, in accordance with certain example embodiments.

FIGS. 1A and 1B depict a system for encoding and decoding audio signals and auxiliary data according to an example embodiment denoted generally as 10. The system 10 includes an encoder 12 and a decoder 18, showed respectively in FIG. 1A and FIG. 1B. The encoder 12 can encode multiple signals of different types and combine the encoded information into a single encoded bitstream 16. The different types of signals include program configurations data 14A, audio signals 14B, data signals 14C, spatial and motion data 14D, and environmental properties data 14E. Each type of signals is associated with an encoder. As shown in FIG. 1A, program encoder 12A is able to encode program configurations data 14A, audio encoder 12B is able to encode audio signals, data signal encoder 12C is able to encode data signals 14C, spatial encoder 12D is able to encode spatial and motion data 14D, and environment encoder 12E is able to encode environmental properties data 14E. The bitstream data generated by encoders 12A-12E are multiplexed using the multiplexer (Mux) 22 to form a single encoded bitstream 16. The system 10 also includes a decoder 18, as shown in FIG. 1B. The decoder 18 decodes the single encoded bitstream 16 and produces decoded program configurations data 20A, decoded audio signals 20B, decoded data signals 20C, decoded spatial and motion data 20D, and decoded environmental properties data 20E. A demultiplexer (Demux) 24 can demultiplex the single encoded bitstream 16, extract and input the demultiplexed bitstream to the corresponding decoders 18A-18E.

Program configurations data 14A can include side data in the bitstream used to define which channels should actually be decoded for a particular program. For example, there could be multiple channels of audio localized to different languages in the same bitstream, and program configurations data 14A could identify which channels to decode, such as decoding a Spanish program versus an Italian program. Channel data that doesn't match the desired program to decode can be skipped. A single bitstream can include a suitable number of channel configurations. Any given program can select which of the channels to decode for a given type of audio signal or data signal packet.

The audio signals 14B may be divided into subcategories as needed. As an example of operation, the audio signals 14B can be divided into five categories: single channel, low-frequency channel, dialogue channel, channel pair and motion channel. A single channel can be used to represent a single audio channel. A low-frequency channel can be used to represent a single audio channel but typically for low frequency audio content. A dialogue channel can be used to represent a single channel of audio dialogue, e.g. actor performances. A channel pair can be used to represent two channels of audio that are typically a stereo pair, e.g., Left and Right channels. A motion channel can be used to represent a single channel of audio, but can include animated spatial information, allowing audio content to be animated to move over time. A single bitstream can include a combination of zero or more audio channels of any of the above categories. Categorizations of audio data such as the examples above can be used to express the intent for how audio and any related spatial information is encoded, optimized or otherwise intended to be used. For example, two audio channels of a channel pair can be encoded together in a way to reduce undesirable artifacts that may otherwise occur between the encoding of two similar audio channels, e.g., Left & Right channels. In another example, the spatial representation of channel pairs can be optimized by having one audio channel be a fixed offset spatially from the other audio channel, thus potentially reducing the data size of the representation of the spatial information. In yet another example, the spatial representation can be differed between the different categories, such as only having static positional data for most categories, but having animated motion for motion channels. The audio signals 14B can be sampled over time at a constant sampling rate, such as from the output of an Analog to Digital Converter (ADC). The sampling rates supported for the encoder 12B, as an example, can include 44.1 kHz, 48 kHz, 88.2 kHz, and 96 kHz, depending on the requirements or needed quality.

Data signals 14C can include side data into the bitstream for a variety of purposes, such as subtitles, album art, studio information, actor biography, video, etc. The codec 10 supports being able to add new types of data into a bitstream while remaining backward compatible with older versions of the decoder 18. In an embodiment of operation, any sort of data can be represented using a data channel. Zero or more data channels can be included in the bitstream. Similar to audio channels, data channels can be selectively decoded by channel. For example, subtitles for different languages could be segregated into different data channels such that a program could select the desired data channels to decode for a desired localization.

Environmental properties data 14E about a spatial environment can be included into the bitstream. This information is used to simulate the characteristics of an environment, e.g. a concert hall versus a small venue or a small tunnel. The environment information can change over time, for example, to reflect the changes of an environment in a movie, and can order a new environment engine constructed in the decoder.

Figure 2:
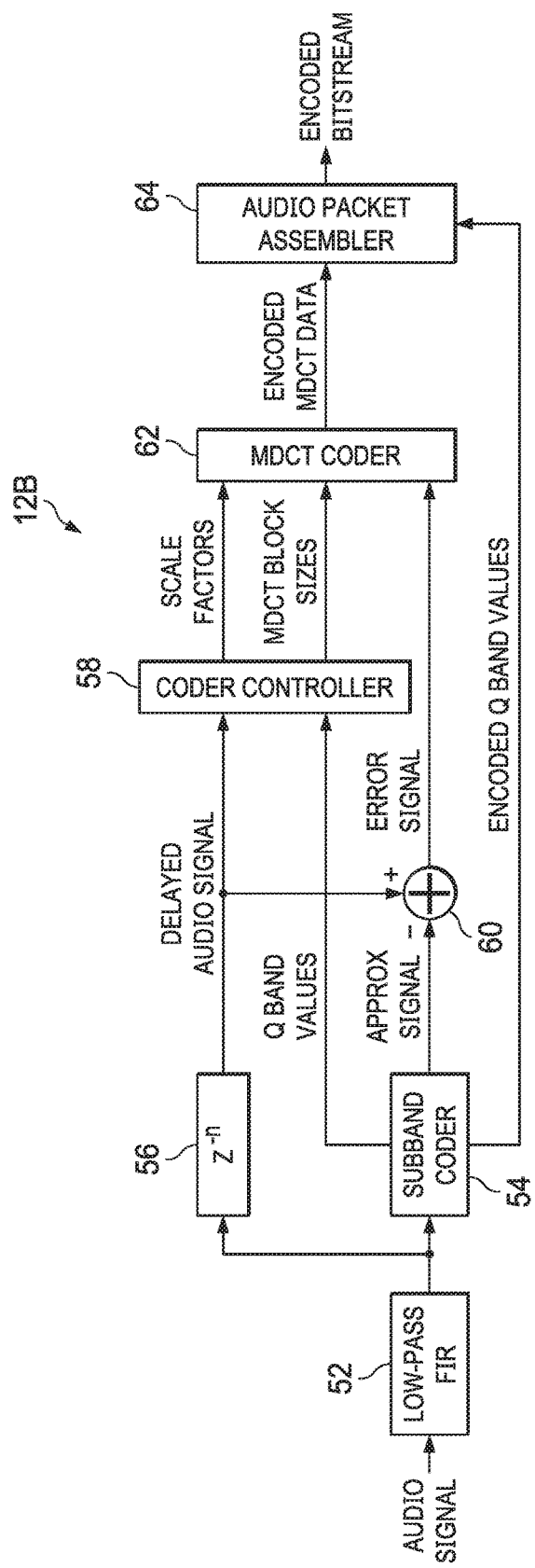
FIG. 2 is a block diagram depicting elements of the audio encoder, in accordance with certain example embodiments.

FIG. 2 depicts a block diagram of audio encoder 12B, in accordance with certain example embodiments. The audio encoder 12B in general comprises a low-pass finite impulse response (FIR) filter 52, a subband coder 54, a $Z^{-n}$ delay component 56, a coder controller 58, an adder 60, a MDCT coder 62, and an audio packet assembler 64. The audio encoder 12B processes sampled audio signals and for a collection of samples generates an encoded bitstream, e.g. a bitstream for use with streaming media players. The subband coder 54 processes audio samples into a plurality of frequency band components, and quantizes those band components by using adaptive pulse code modulation (APCM) or adaptive differential pulse code modulation (ADPCM) into quantized band values. In the example embodiment, the subband coder 54 generates three outputs: quantized band values (Q band values), encoded quantized band values (encoded Q band values), and an approximate signal. The Q band values are inputted to the coder controller 58 in order to detect pre-echo events. The encoded Q band values are further added to the bitstream. The approximate signal is created by first converting the Q band values back into the plurality of frequency band components using Inverse APCM or Inverse ADPCM, and then converting the frequency band components back into audio samples. An error signal, which is the difference between the original audio input and the approximate signal, is generated and provided for the MDCT coder 62. The coder controller 58 determines scale factors and modified discrete cosine transform (MDCT) block sizes to be used to encode the error signal. The MDCT coder 62 transforms the error signal into frequency component line values (MDCT line values) using the determined MDCT block sizes. The MDCT block sizes, scale factors, and MDCT line values are then quantized and encoded for inclusion in the bitstream.

In one embodiment, the low-pass FIR 52 receives audio signals 14B and removes undesirable high frequency content, such as content near the Nyquist rate and content that is difficult or beyond the ability of humans to hear. For example, the Nyquist rate of audio sample rates of 88.2 kHz and 96 kHz are 44.1 kHz and 48 kHz respectively, which are well beyond the ~20 kHz upper limit sensitivity of a human ear. The delay component 56 feeds a delayed version of the sampled signals to adder 60 and coder controller 58. An approximate signal generated from the subband coder 54 can be subtracted from the delayed original signal to create an error signal. The error signal is the difference between the original audio signal and the approximate signal.

The coder controller 58 receives and processes the filtered and delayed audio signal and Q band values, and generates MDCT block sizes and scale factors that can be used by the MDCT coder 62 to encode the error signal so that pre-echo effects are minimized or eliminated. The MDCT coder 62, in response, MDCT encodes the error signal using the MDCT block size values and scale factors. The encoded MDCT data can then be provided to the audio packet assembler 64 for later inclusion into the single encoded bitstream 16 as output to relevant audio channel packets. Further details of the subband coder 54, coder controller 58, and MDCT coder 62 are described below.

Figure 3:
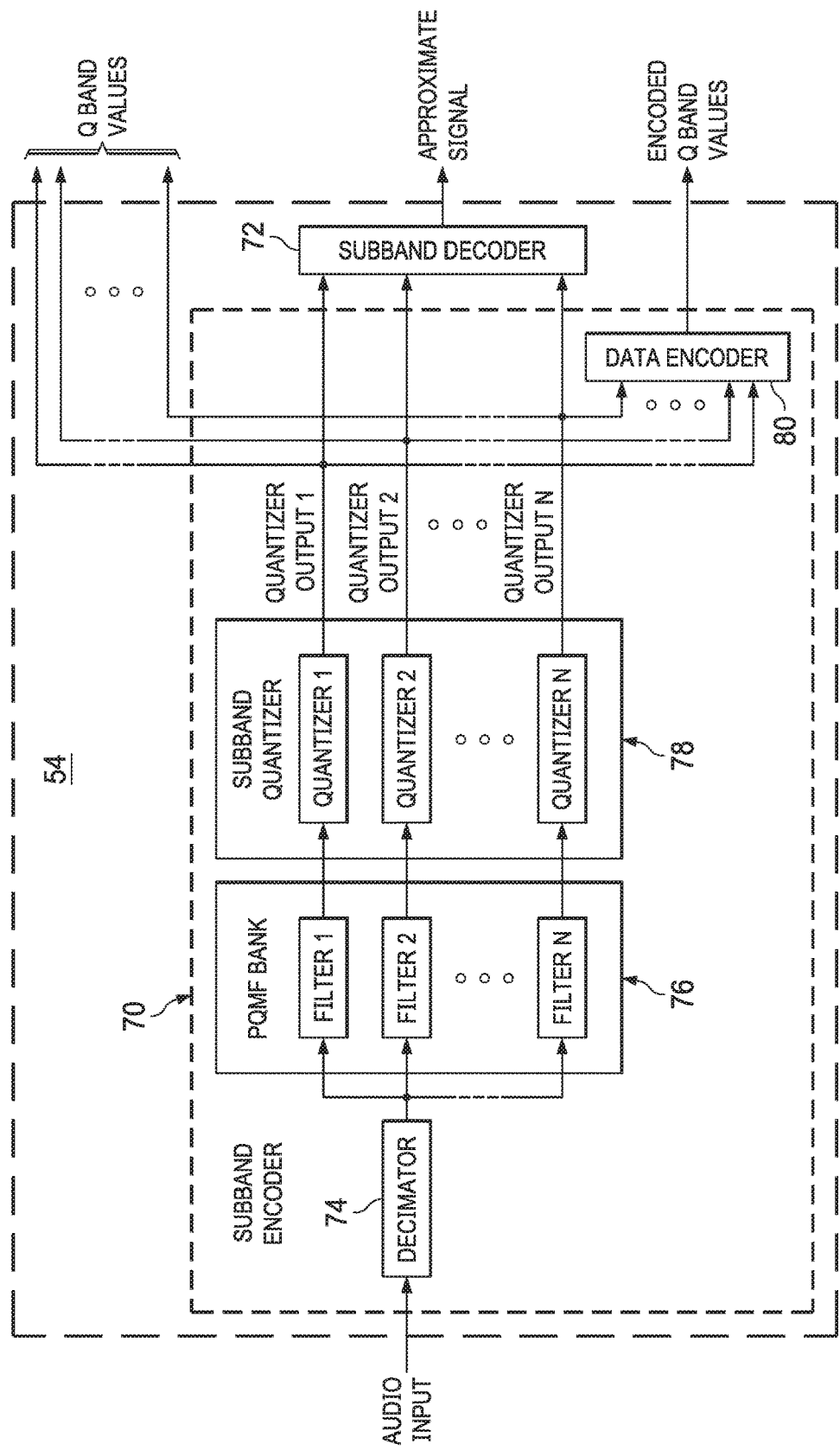
FIG. 3 is a block diagram depicting a subband coder, in accordance with certain example embodiments.

FIG. 3 depicts a block diagram of the subband coder 54 in accordance with certain example embodiments. In one embodiment, the subband coder 54 includes a subband encoder 70 and a subband decoder 72. The subband encoder 70 can use a decimator 74, e.g. for higher sample rates, pseudo quadrature mirror filter (PQMF) bank 76, subband quantizer 78, and a lossless data encoder 80 to quantize and encode filtered audio signals 14B. Subband quantizer 78 can use APCM or ADPCM system. In essence, the subband coder 54 includes PQMF bank 76 and subband quantizer 78 that can be used to filter and pulse code modulate bands of sampled audio data to produce APCM or ADPCM quantized output. The quantized output can include artifacts, such as those produced as part of the quantization or as a result of signal aliasing to be introduced into downstream audio processing. The quantized band values generated by the subband quantized are always used to determine pre-echo information, which will be discussed below. However, the subband decoder 72 optionally use none, some or all of the APCM or ADPCM quantized output as needed by flagging that in the bitstream. The data encoder 80 can encode the quantized output for transmission as needed by the flag in the bitstream, where the data encoder 80 can be Huffman encoder or other lossless encoder.

The quantized output can be sent to the subband decoder 72 to generate approximations of the original input samples. Specific details of the decoding functionality of the subband decoder 72 will be discussed in reference to FIGS. 17-19. Although it should be clear, the subband decoder 72 is implemented within the context of the audio signal encoder 12B when discussing encoding processes. In general, however, and as previously discussed, the decoded digital audio samples, i.e. the approximate signal, are subtracted from the delayed input audio signal 14B to generate the error signal. Optionally, none, some or all of the quantized output is used to generate approximate signal. Thus, the approximate signal can include band data or not. The error signal can be the entire signal when the approximate signal is 0. Q band values and a delayed version of the original sampled audio signals can be provided to coder controller 58 to compute the MDCT block sizes and scale factors, which are provided together with the error signal to the MDCT coder 62. In addition, quantized output can be provided to the data encoder 80 to losslessly encode using a lossless data encoding such as Huffman or Arithmetic encoding.

For higher sample rates, e.g., 88.2 kHz and 96 kHz, audio signals 14B may be passed through a decimator 74, although it should be understood that lower sampling rate, e.g. 44.1 kHz and 48 kHz, may be used directly without decimation. Whether the decimator 74 provides processed audio signals 14B or audio signals 14B are provided directly, the PQMF bank 76 produces a range of frequency information found in the original signal. As an example configuration, the PQMF bank 76 can include sixteen PQMFs and each PQMF can be a collection of finite impulse response (FIR) filters. Blocks of audio input samples can be provided to the PQMF bank 76 and a response value per filterbank can be determined. Each filter value can be inputted into a subband quantizer 78 to generate a quantized value per filter.

As an example, subband quantizer 78 breaks the filtered sampled data into 15 bands, although more or less could be used. In addition, the subband quantizer 78 can functionally process the band signals from the PQMF filtered audio signals using a detection threshold value for each band, e.g. 20 to 40 dB. Noisy artifacts adjacent to audio bearing signals can be marked, that is to say quantized, in a manner that indicates the signal is a noise artifact.

Figure 4:
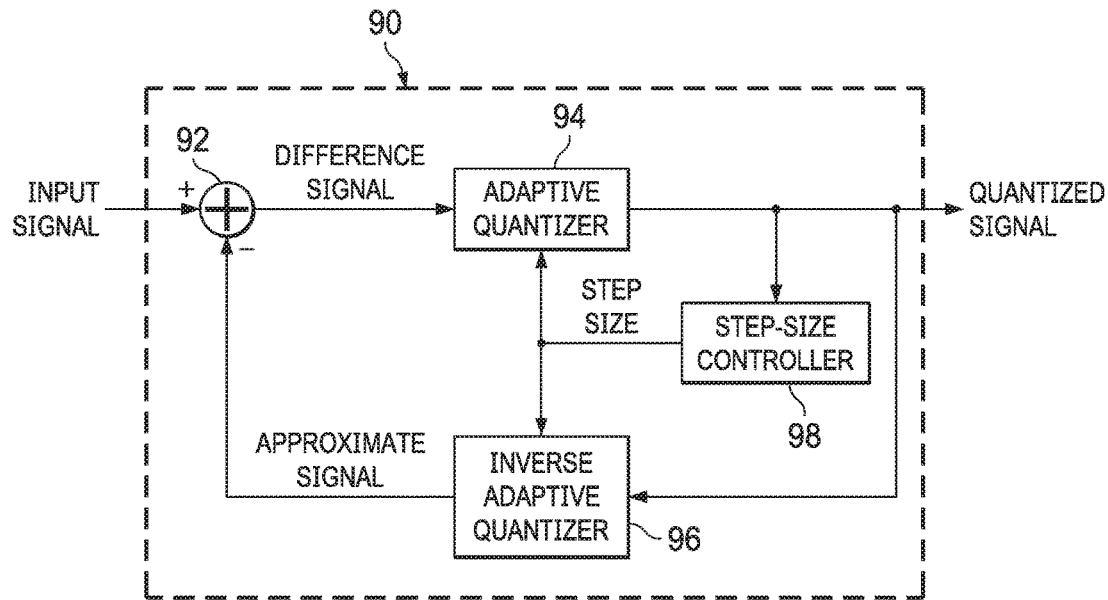
FIG. 4 is a block diagram depicting an APCM quantizer, in accordance with certain example embodiments.

FIG. 4 depicts a block diagram of a single APCM quantizer 90 as an example of implementation from the subband quantizer 78, in accordance with example embodiments. An APCM quantizer 90 includes an adder 92, an adaptive quantizer 94, an inverse adaptive quantizer 96, and a step-size controller 98. In essence, the APCM quantizer 90 maps the input value to a smaller set of values where the mapping is adaptively changing using the step-size controller 98. Referring back to FIG. 3, the quantized outputs produce multiple digital representations. Optionally, when employing an adaptive differential pulse-code modulation (AD-PCM) quantizer instead of an APCM quantizer, a predictor may be used to possibly reduce the difference signal value.

In operation of an embodiment, an input audio signal to be encoded is received at a positive input of the adder 92. A negative input of the adder 92 receives an approximate signal generated by the inverse adaptive quantizer 96 as a feedback signal. The adder 92 generates a difference signal which is provided to the adaptive quantizer 94. The adaptive quantizer 94 receives the difference signal and generates an output signal representing the difference signal as a series of quantized signals representing different signal levels. The quantized signal output by the adaptive quantizer 94 is the output quantized signal of the encoder 90. The step-size controller 98, see FIG. 5 described below, detects transient signals to determine the step size employed by the adaptive quantizer 94 and the inverse adaptive quantizer 96. The inverse adaptive quantizer 96 generates an approximate signal based on the quantized signal output by the adaptive quantizer 94 and the current step size value set by the step-size controller 98.

Figure 5:
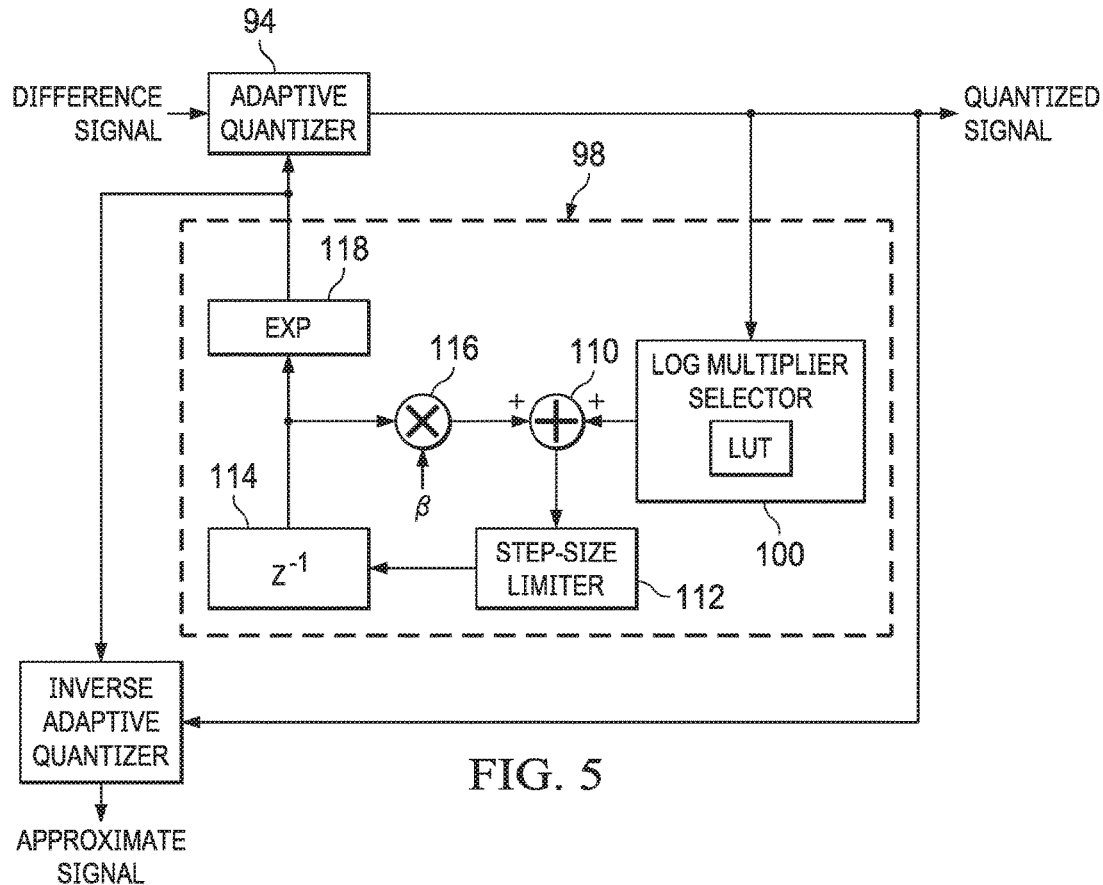
FIG. 5 is a block diagram depicting a step-size controller, in accordance with certain example embodiments.

FIG. 5 depicts a block diagram of an embodiment of a step-size controller denoted generally as 98, which may be used, for example, in the embodiment of the adaptive quantizer 94 or in the embodiment of the inverses adaptive quantizer 96. As illustrated, the step-size controller 98 comprises a log multiplier selector 100 which selects a log multiplier based on the current quantized signal. The log multiplier selector 100 can select a log multiplier based on historical data, such as previous quantized signals, and can comprise a look-up table (LUT), which may be updatable, for example, based on historical data, in an update download, etc. The log multiplier selector 100 can select a log multiplier based on statistical probabilities based on current and previous quantized signals. The step-size controller 98 further comprises an adder 110 which receives at a first positive input from the selected log multiplier, and provides an output to a step size limiter 112. The step-size limiter 112 examines the step size across all bands and sets a minimum value should any value fall below the minimum value. The minimum value can comprise a fixed or variable value, which is depending on which bands are in use and its statistics. The output of the step-size limiter 112 is provided to a delay circuit 114. The output of the delay circuit 114 is provided to a multiplier 116 and to an exponential circuit 118. The multiplier 116 multiplies the output of the delay circuit 114 by a scaling or leakage factor β, which may typically be close to and less than 1, and provides the result to a second positive input of the adder 110. The leakage factor may typically be a constant, but may be variable in some embodiments, for example, based on the previous step-size control signal or other historical data. The selection of a scaling factor β as close to and less than 1 facilitates reducing the impact of selection of an incorrect step size, for example due to a transmission error, as the introduced error will decay away.

The exponential circuit 118, in operation, generates a step-size control signal based on the output of the delay circuit 106. As illustrated, the step-size control signal is provided to the adaptive quantizer 94 and to the inverse adaptive quantizer 96. As illustrated, the quantizer step-size controller 98 operates in a logarithmic manner, which may simplify the calculations. Some embodiments may employ a look-up table for faster but less precise result. Other embodiments may operate in a linear manner, and may, for example, employ a multiplier instead of the adder 110, and an exponential circuit instead of the multiplier 116. The step-size controller 98 as illustrated operates in a logarithmic manner, and the step sizes selected based on the step-size control signal vary in an exponential manner.

In an embodiment, the quantizer step-size controller 98 may operate in accordance with equation 1, below:

$$d_{n+1} = \beta d_n + m(c_n) \qquad \text{Equation 1}$$

where $d_n$ is the step size in the log domain, $m(c_n)$ is the log multiplier selected based on the current quantized signal, and β is the scaling factor or leakage coefficient.

Figure 6:
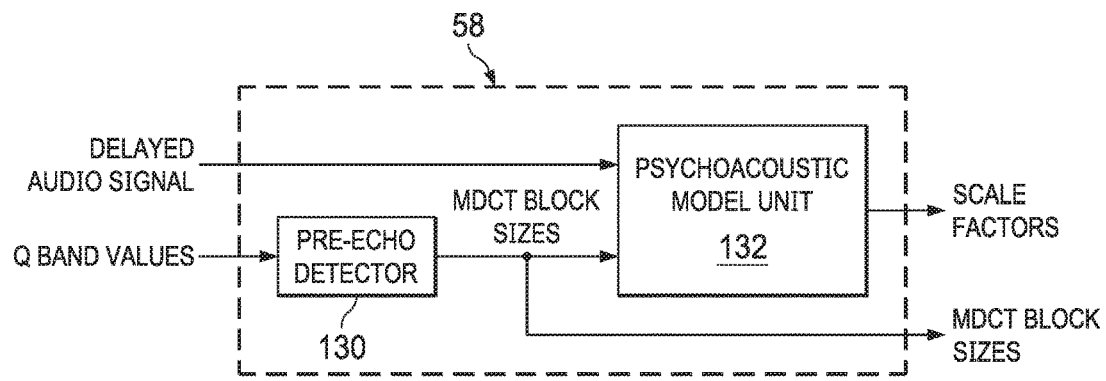
FIG. 6 is a block diagram depicting a coder controller, in accordance with certain example embodiments.

FIG. 6 depicts a block diagram of the coder controller 58, in accordance with certain example embodiments. The coder controller 58 comprises a pre-echo detector 130 and a psychoacoustic model unit 132. In essence, the coder controller 58 collects the delayed audio signals and Q band values and then determines MDCT block sizes and scale factors for further processing by the MDCT coder 62. With reference more particularly to FIG. 6, the pre-echo detector 130 can detect pre-echo and determine MDCT block sizes based on characteristic of an input audio signal, and input the determined MDCT block sizes information to the psychoacoustic model unit 132 and the MDCT coder 62 for further processing. The pre-echo detector 130 operates to be always on. Although, in other embodiments it can operate to be selectively on. When operating with stationary or slowly varying signals, the subband coder 54 provides small absolute value of the Q band values. When an audio signal that can cause pre-echo is processing, for example, in audio with sharp impulses and transient signals such as percussive instruments where pre-echo is especially noticeable, one or more large absolute value of the Q band values may transitively occur due to the adaptive nature of adaptive pulse code modulation. When an absolute Q band value exceeds a given threshold value, the pre-echo detector 130 can detect such change and indicate a pre-echo event exists. The requirement to switch the block length (size) at or below a specific block length (size) is then triggered. By adopting a shorter block length, pre-echo can be suppressed. A shorter block length can be chosen based on several factors, such as the magnitude of the Q value and which band contained the Q value. The thresholds and block length requirements can vary per band. For example, exceeding a threshold in a lower band may require that the block length be 256 or smaller, while exceeding a similar threshold in a higher band may require that the block length be 64 or smaller. If more than one threshold is crossed, then the most restrictive (smallest) block length is used. In addition, transitioning directly from a large block length to a small block length can cause undesirable distortions. The pre-echo detector 130 can look ahead by prefetching audio content such that it can transition up or down in block length over time. For example, instead of switching from a block length of 4096 directly to a block length of 128, the pre-echo detector 130 may generate block lengths to transition from 4096 to 1024 to 256 to 128, thus reducing undesirable distortions from any single large transition while still achieving the target 128 block length for the audio that requires that block length.

The psychoacoustic model unit 132 can utilize the MDCT block sizes information indicated by the pre-echo detector 130, and then output scale factors to MDCT coder 62. In one embodiment, the psychoacoustic model unit 132 can employ the MPEG-1 Psychoacoustic Model 2 standardized by the Moving Picture Experts Group (MPEG), which mirrors the characteristic of human hearing and reduces perceptual redundancy of the audio signal. More information on MPEG-1 Psychoacoustic Model 2 may be found in ISO/IEC 11172-3:1993, *Information technology—Coding of moving pictures and associated audio for digital storage media at up to about* 1.5 *Mbit/s—Part* 3: *Audio*, August, 1993.

Figure 7:
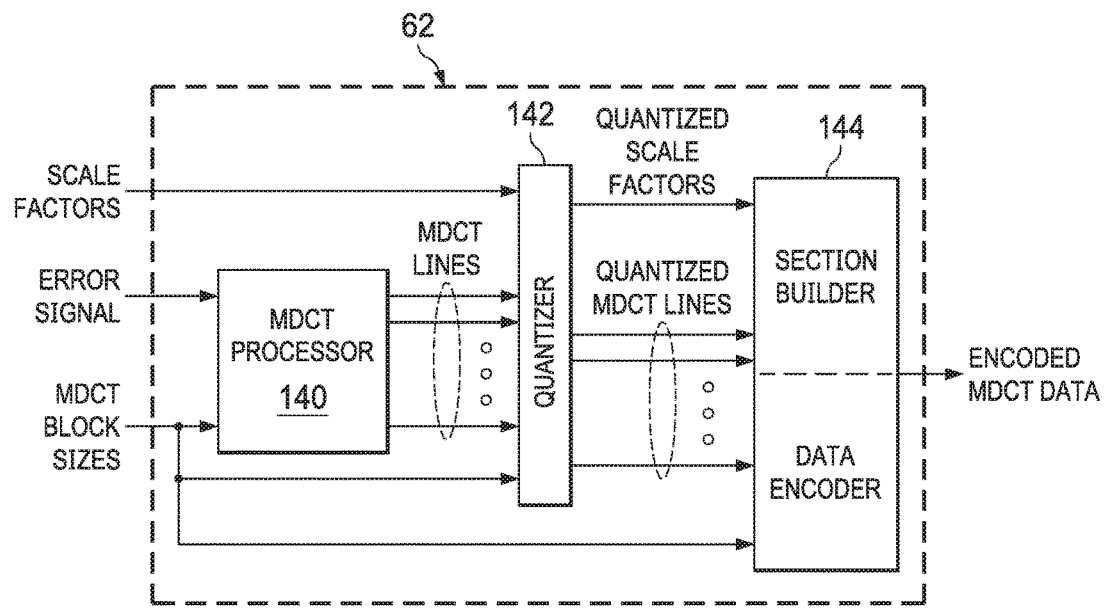
FIG. 7 is a block diagram depicting a MDCT coder, in accordance with certain example embodiments.

FIG. 7 depicts a block diagram of MDCT coder 62 in accordance with example embodiments. MDCT coder 62 includes an MDCT processor 140, a quantizer 142, and a section builder and data encoder 144. In essence, the MDCT coder 62 transforms the error signal into frequency domain using MDCT, quantizes the resulting MDCT line values and scale factor values, and encodes both the quantized MDCT lines and the quantized scale factor values, providing the results as encoded MDCT data that can be packetized for inclusion in the single encoded bitstream 16. In one embodiment, the MDCT processor 140 uses samples from the error signal along with a previous MDCT block length, a current MDCT block length, and a next MDCT block length. A MDCT does a transform of the error signal from the time domain to a short-time frequency domain, resulting in a set of MDCT line values. The count of line values can be referred to as MDCT block length or MDCT block size. Mathematically it can be advantageous to use block lengths that are a power of 2. For example, for sampling rates of 48 kHz and below it can be reasonable to use block lengths of 64, 128, 256, 512, 1024, 2048 and 4096. At higher sampling rates such as 96 kHz and below it can be reasonable to use block lengths of 128, 256, 512, 1024, 2048, 4096, and 8192. At even higher sampling rate such as 192 kHz and below it can be reasonable to use block lengths of 256, 512, 1024, 2048, 4096, 8192, and 16384, etc. Every input sample is encoded twice using two overlapped MDCTs. Similarly, the decoder 18 decodes the results of two MDCTs using inverse MDCTs in order to regenerate an original input sample. The data is windowed when converting to frequency domain, such as using a sine window. However, if MDCT block lengths do not match, the window can be distorted to account for the transition between the differing sizes. Since each sample is encoded twice, the windowing must be done in a way that an original sample can be regenerated in the decoder by summing the results of doing two Inverse MDCTs. Essentially, a new MDCT can be performed using the second half of the previous MDCTs input samples and another half worth of new input samples; where a half is equal to the block length if both MDCTs have the same block length. In this example, the input to each MDCT is twice the MDCT block length. The number of samples of overlap vary when the block length of the next MDCT changes from the previous block. Several simplified examples will be discussed in FIG. 8 to FIG. 10.

The scale factor values can be quantized into an integer dB representation in order to reduce the count of bits needed to represent those values in the bitstream:

Scale Factor dB=floor(20*log 10(scale Factor/$2^{-24}$)).

The resulting scale factor dB values can be clamped to a range, such as [0, 255]. If the scale factor values are quantized and/or clamped for the bitstream then the MDCT coder 62 should compute new scale factor values based on the quantized scale factor dB values in order to be consistent with the math done by the MDCT decoder 256 (discussed below). The MDCT line values can be quantized by dividing each line by its associated scale factor values and rounding the result to an integer value. In an embodiment, MDCT lines can be segregated into scale factor bands where all lines in the same scale factor band share a common scale factor dB value. Therefore, the line Q (quantized) values and a scale factor dB per scale factor band can be stored in order to encode the results of the MDCT such that the MDCT decoder 256 can do an Inverse MDCT. The MDCT line values representing high frequencies that are difficult or impossible to hear can be omitted, i.e. treated as zero.

The section builder and data encoder 144 is used to store the quantized scale factor dBs and MDCT line values in a lossless manner in the bitstream. The intent is to use as few bits as possible to represent the encoded information. As an example embodiment one can segregate the information into sections and use different Huffman code books based on the needs of a particular section. Each section would contain one or more contiguous scale factor bands. The Huffman codebook to use to encode the quantized (Q) MDCT line values for a section can be selected based on the maximum absolute Q value found in that section, thus using smaller Huffman representations for smaller absolute Q values. An additional improvement can be to combine multiple Q values into a single value to Huffman encode. For example, the 4 Q values of 0, 0, 0, 0 could be combined to form a single Huffman symbol, making it possible for the encoded Q values to be represented by fewer bits than encoding each of the 4 Q values separately. Another potential improvement can be to tune different Huffman codebooks for wideband audio content versus narrowband audio content, such that wideband content will tend to be representable in less bits with a Huffman codebook tuned for wideband content and narrowband content will tend to be representable in less bits with a Huffman codebook tuned for narrowband content. An example implementation can be to initially create a section for each scale factor band, and then merge contiguous sections together if the size in bits of representing the merged sections is smaller than the size in bits of representing the sections unmerged. Refer to the table below (Table 1) as an example of using multiple Huffman codebooks. In that table there are 16 possible Huffman codebook values, with 15 actual Huffman codebooks, and a codebook value of 0 used for a common case where all Q values in a section are 0. The first column of the table shows the codebook value. The second column of the table is the maximum absolute Q value representable by that codebook. The third column shows the type of codebooks (e.g., tuned for narrowband versus tuned for wideband). The fourth column shows how many Q values to pack together to form a Huffman symbol for the associated codebook.

TABLE 1

| Huffman Codebook | Maximum Abs(Q) value | Codebook Type | Q Values Per Code Word |
|---|---|---|---|
| 0 | 0 | All zeros | None |
| 1 | 1 | Narrowband | 4 |
| 2 | 1 | Wideband | 4 |
| 3 | 2 | Narrowband | 4 |
| 4 | 2 | Wideband | 4 |
| 5 | 3 | Narrowband | 4 |
| 6 | 3 | Wideband | 4 |
| 7 | 5 | Narrowband | 2 |
| 8 | 5 | Wideband | 2 |
| 9 | 11 | Narrowband | 2 |
| 10 | 11 | Wideband | 2 |
| 11 | 31 | Narrowband | 2 |
| 12 | 31 | Wideband | 2 |
| 13 | 63 | Narrowband | 1 |
| 14 | 63 | Wideband | 1 |
| 15 | >=64 | Escape | 1 |

So, for example, if the maximum abs(Q) value found in a section is 4, you can use Huffman codebooks 7 through 15. Note that codebook 0 is used in the case where all Q values are zero. In this case, all of the Q values for the scale factor bands in question are omitted, as well as the scale factor dB values for those scale factor bands. Typically, the codebooks with the smallest maximum absolute Q value restriction that can be used will be able to represent the Q values of a section in the least amount of bits. For example, if the maximum abs(Q) value is 4 then typically either Huffman codebook 7 or 8 will be the best codebook to use for that section; however, this is not always the case. For example, it is possible that a better overall result may be obtained by merging two or more sections even if it means a codebook with a larger maximum abs(Q) value will have to be used across the merged sections. This is typically due to the side data overhead of specifying multiple sections versus specifying a single merged section. An embodiment of a data encoder could try the various combinations of merging sections trying usable codebooks and choose the combination that result in the overall smallest bit size in the bitstream.

Since abs(Q) values in the above example can be used to create Huffman codes, for Q values that are non-zero, an additional sign bit per Q value is stored in the bitstream. Note that in the example above, the escape codebook only has Huffman symbols for abs(Q) values from 0 to 63. An additional Huffman value can be added to the Huffman table to represent an escape code, e.g. the value of 64, signifying that the abs(Q) value was too large to be represented directly by a Huffman symbol, and the Q value is instead written directly following the escape symbol in the bitstream. A simple example can be to write the Q value itself using a fixed number of bits for the worst case representation needed, such as 16 bits; however, there are other representations for values 64 or greater that may average less than using a worst case fixed bit length. The scale factor dB values can be encoded separately using a different Huffman codebook that has been tuned specifically for delta scale factor dB values. As an example, the data encoder 14 could encode the first meaningful scale factor dB value in its entirety, such as using 8 bits, and then use Huffman encoding to encode the difference between each scale factor dB value and the previous scale factor dB value for the remaining scale factor dB values.

Figure 8:
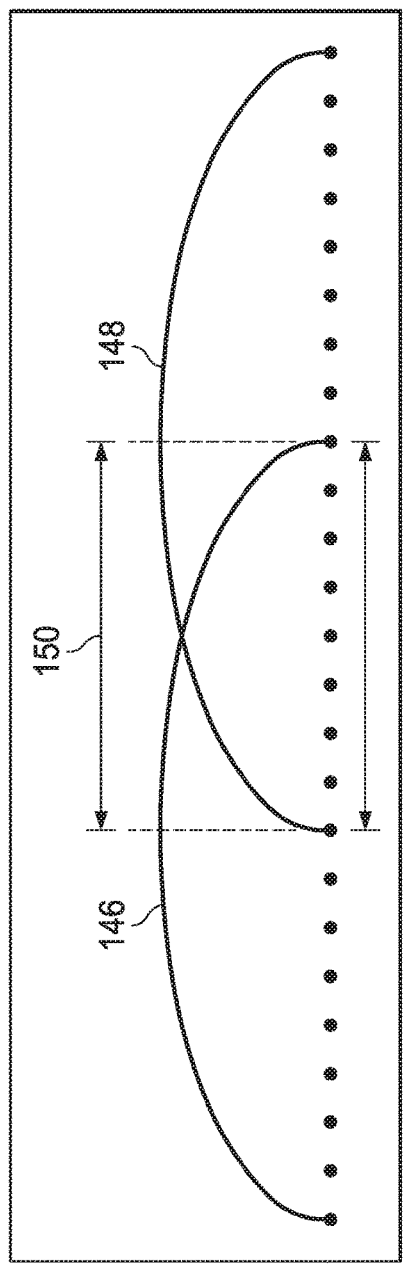
FIG. 8 is a data block depicting two MDCTs each having a block length of 8, in accordance with certain example embodiments.

FIG. 8 is a simplified example using sine windows where a first MDCT window 146 and a second MDCT window 148 that each has a block size of 8 are calculated and having overlapping samples, i.e. the MDCT block 150. The first MDCT window 146 is calculated with 16 samples. The second MDCT window 148 is calculated with 16 samples but the first half of the MDCT window 148 covers the second half of the first MDCT's window 146 producing the overlapped 8 samples or rather MDCT block 150. These overlapped 8 samples can be transformed by the first MDCT window 146 and the second MDCT window 148. If any one of those 8 samples were picked, then it could be said that the first MDCT 146 was calculated using the sample multiplied by the sine window of MDCT window 146 and the second MDCT was calculated using the sample multiplied by the sine window of MDCT window 148. As such, when inverse MDCTs are calculated, the results from each IMDCT for the sample can be added to recover the original value of the sample. The sample's contribution from each calculated MDCT may be scaled by the square of the sine window value for a particular sample. In this example, both windows are sine windows and they are mirrors of each other. If the squares of the MDCT window 146 and MDCT window 148, i.e. value of MDCT window 146 multiplied by value of MDCT window 146 is added to value of MDCT window 148 multiplied by value of MDCT window 148, the resulting value is 1.0. In this example, the value when both windows cross and have the exact same value is equal to the sine of 45 degrees, which is approximately 0.7071. If the value is squared for each window and the contributions are summed, the resulting value is 1.0. For each sample in the window, the resulting window sum is $\sin^2(\theta)$ plus $\cos^2(\theta)$, which is always equal to one.

Figure 9:
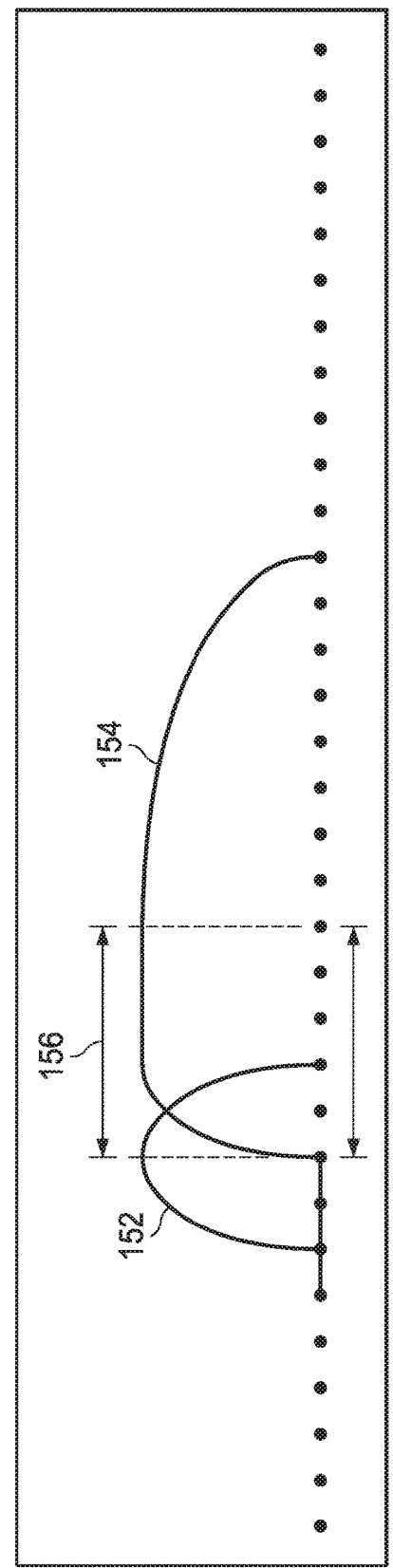
FIG. 9 is a data block depicting two MDCTs having block lengths of 2 and 8, in accordance with certain example embodiments.

FIG. 9 depicts another example using sine windows with a first MDCT window 152 with block size of 2, a second MDCT window 154 with a block size of 8, and a MDCT block 156. As in the previous example, the MDCT block 156 defining the overlapping areas is of importance in determining how to distort the window so that desired values can be produced. Sine windows are also used but the second MDCT window 154 is distorted so that the samples that were multiplied by the second half of the first MDCT window 152 can also be multiplied by the square root of 1.0 minus the value of the second MDCT window 154. For these two samples, the values of the first MDCT window 152 added to the values of the second MDCT window 154 must sum to 1.0. So the next problem is that the first half of the second MDCT window 154 is longer than the second half of the first MDCT window 152. That problem is addressed by flattening the second MDCT window 154 to 0.0 for the samples before the overlap and flattening the second MDCT window 154 to 1.0 for samples after the overlap. In addition, the windows are calculated and distorted so that the newer half of the previous window matches the older half of the current window, and the newer half of the current window must match the upcoming half of the next window. When MDCT sizes do not match, the sine window is done on the shorter of the two sizes, and 1 or 0 are done to the responsive parts of the longer window. These two MDCT windows may be required to be normalized when they are differing sized windows to have the values sum to 1.0. The effects on gain were not addressed in the interest of keeping the above example simple.

FIG. 10 shows another example using sine windows with a first MDCT window 158 with block size of 2, a second MDCT window 160 with block size of 8, a third MDCT window 162 with block size of 2, a MDCT block 164A and a MDCT block 164B. As in the previous example, the first half of the second MDCT window 160 is distorted so that MDCT block 164A is where it overlaps with the first MDCT window 158 and the two window values will sum to 1.0. Similarly, since the third MDCT window 162 includes a smaller block size, the second half of the second MDCT window 160 is distorted so that summing it with third MDCT widow 162 will result as 1.0. The portion of the second MDCT window 160 before the overlap MDCT block 164B is flattened to 1.0 and the portion of the second MDCT window 160 after the overlap MDCT block 164B is flattened to 0.0. Note that again the effects on gain have been ignored in the interest of keeping the example simple. Also note that all of the simplified examples above are using sine windows; however, other windows can be used as long as the effects of the windowing can be countered in the decoder to properly regenerate the original sample.

Since MDCTs are overlapped, samples may not be fully decoded in the audio decoder 18B without decoding the data from two MDCTs using Inverse MDCTs. The issue that samples may not be fully decoded in the audio decoder 18B without decoding the data from two MDCTs brings up a need for a MDCT primer block. In a startup condition only one MDCT block length worth of samples may be available to fill the two MDCT block lengths worth of samples needed to perform an MDCT. In this startup condition, an MDCT block length worth of zeros followed by an MDCT block length of actual input samples can be used. The results of doing this initial MDCT is referred to as the primer block. In an embodiment, the audio decoder 18B can identify the primer block as a special case, meaning that decoding of the primer block is not an actual full decoding of any samples but rather is just priming the channel such that the decoding of MDCT blocks that follow can decode actual samples.

FIG. 11 is an example embodiment of a minimal bitstream representation of a property. The data signal encoder 12C encodes most data signals 14C through the use of properties. A single property can be used to represent any sort of desired data in a backward compatible and extensible format. Note that most types of data signals 14C are encoded as properties that are part of a data channel packet; however, due to the flexibility of properties they also may be used inside other packet types. The essence of a property is that it can be identified by a type value and its data can be skipped when decoding without having to know what the property's data actually represents. To achieve this a property is minimally represented by a property type and a data size, and includes additional data as relevant, i.e., when the data size is not zero. In this example, 6 bits define the property type 166 and 2 bits define the property data size 168. 6 bits provides 64 possible property type values [0, 63]. One of those values (e.g., 63) can be reserved to indicate that the property type cannot be represented in the remaining [0, 62] value range so the actual property type is instead stored next in the bitstream in a representation that can be larger than 62, such as a byte packed integer (explained later). The 2 bits used to define the size of a property's data can represent 4 possible values [0, 3]. The values of 0, 1 and 2 can represent a size in bytes (0 bytes, 1 byte or 2 bytes) of data, and a value of 3 can indicate that the data's size is stored next in the bitstream in a representation that can specify a size larger than 2 bytes, such as a byte packed integer (explained later). With this example representation a single property type 166 and data size 168 can be described in as little as 8 bits, and can use additional bits as needed to represent larger property type and/or data size values. Using this format, a decoder can decode any property's type and data size, and then can decode the property's data if it is a known property type and relevant, or can simply skip over the property's data if it is an unknown property type or not relevant.

Property types can be globally defined as part of a standard and new properties can be added to the standard while maintaining backward compatibility with older decoders since unknown property types can simply be skipped.

Figure 13:
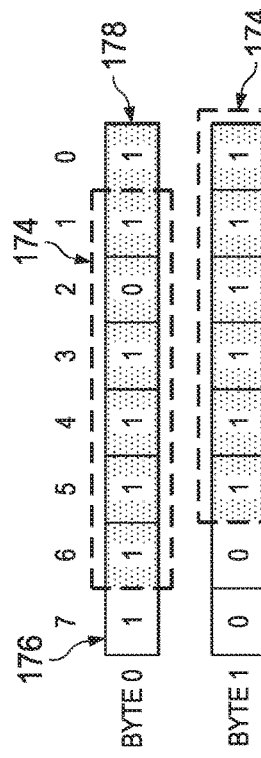
FIG. 13 is an example of storing a signed integer value in a variable number of bytes, in accordance with certain example embodiments.

FIG. 12 depicts an example of storing an unsigned integer value in a variable number of bytes, while FIG. 13 depicts an example of storing a signed integer value in a variable number of bytes. The encoder 12 may need to store integer values in the bitstream where the values are typically very small, but can occasionally be large. In order to minimize the total count of bits it can be useful to represent an integer in a format that will use less bits for the more commonly occurring integer values. One example of this is byte packed integers where smaller integer values are packed into less bytes than larger integer values. For unsigned 32-bit values, this can be done by encoding up to 7 bits of the integer value into a byte and using the remaining eighth bit (bit 7) as an extend flag. If the extend flag is clear, then all of the bits of the integer are decoded and decoding can stop. If the extend flag is set, then the integer continues into the next byte. For example, if the 32-bit unsigned integer value of 4094, (00000000 00000000 00001111 11111110 in binary), were to be encoded, it can be stored as shown in FIG. 12. The bits 170 are the bits of the 4094 integer value up to the highest set bit. The bits 172 are the extend flags. So instead of storing the value as 4 bytes (32 bits/8=4 bytes), it can be stored as 2 bytes. Signed 32-bit integer values can be stored slightly differently. If the value is negative, all bits are inverted and an invert flag bit is set. The invert flag can be stored as bit 0 in the first byte. For the very first byte you have the invert flag bit 0, up to 6 bits of the inverted integer value, and an extend flag (bit 7). Only the first byte has the invert flag. All other bytes use 7 bits for the inverted integer value and 1 bit for the extend flag. For example, if the 32-bit signed integer value of −4094 were to be encoded, shown in two's complement big endian binary: 11111111 11111111 11110000 00000010, first invert the value since the value is negative, which would then give: 00000000 00000000 00001111 11111101 and those bits can be stored as shown in FIG. 13. The bits 174 are the bits of the inverted −4094 integer value up to the highest set bit. The bits 176 are the extend flags. The bit 178 is the invert bit.

Program configurations data 14A describe what types of data in the bitstream to decode for a given program, e.g., Spanish vs. English, director's commentary vs. no director's commentary, etc. The information about each program configuration can be encoded and inserted into a program configuration packet that is later written to the single encoded bitstream 16. The bitstream format is capable of supporting all programs and programing information changing after a synchronization point in the stream.

The encoder 12 can take multiple types of inputs (14A, 14B, 14C, 14D, 14E) and encode the data into a single bitstream of packets. A packet is in essence composed of a packet type and a payload (data), and if the packet has channel specific data it also has a way of specifying the associated channel(s). The decoder 18 will identify a packet type and dispatch packets to subsystems to be decoded as appropriate. Since the most common packet types are channel related packet types (audio and data packets) a simple example embodiment can use a byte (8 bits) as the initial header for all packets, as shown in Table 2. In that example the upper 3 bits are used to represent 8 different packet types, and the lower 5 bits are used to represent additional information, such as a channel number for channel related packets (audio and data packets). Following that header byte could be the remaining payload of the packet. Note that having packets always aligned to start on a byte (8 bit) boundary may be desirable for digital encoding/decoding, although it would mean that up to 7 extra bits of padding would sometimes have to be added to ensure a packet began on a byte boundary. Table 3 shows an example of packet types in an embodiment.

TABLE 2

| Bits | Description |
| --- | --- |
| 0-4 | Value. For channel related packets this can be the channel index. For commands this can be a command value. |
| 5-7 | Packet type. |

TABLE 3

| Name | Description |
| --- | --- |
| Single Channel | An audio channel. |
| Low-frequency | A low-frequency audio channel. |
| Dialogue Channel | An audio dialogue channel. |
| Channel Pair | An audio channel pair. |
| Motion Channel | An audio channel with spatial motion. |
| Data Channel | A data channel. |
| Command Channel | A command. |
| Reserved | Reserved for future expansion. |

Figure 14:
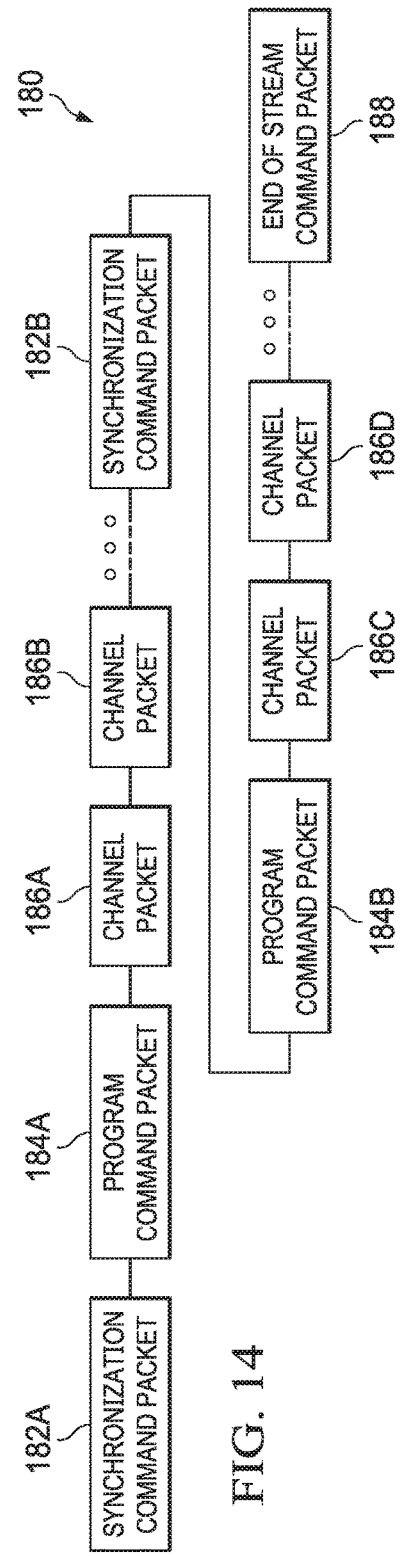
FIG. 14 is a packet diagram depicting a bitstream packet configuration, in accordance with certain example embodiments.

FIG. 14 depicts bitstream packet configuration in accordance with certain example embodiments denoted generally as 180. In general, the bitstream packet configuration 180 comprises a series of packets configured into sets. In one embodiment, the bitstream packet configuration includes synchronization command packets 182(A, B), program command packets 184(A, B), channel packets 186(A, B, C, D) for a period of time, e.g. a half second, and an end of stream command packet 188. The channel packets 186(A, B, C, D) can be any one of or any combination of the channel related packets types, e.g. audio packets and/or data packets. It should also be understood that a set within the series could have more channel related packets or possibly none, and within the set there can be more than one program command packet.

A command packet carries data needed by the decoder 18 to decode the bitstream. A synchronization command packet defines an entry point for decoding the bitstream. If the decoder is joining a bitstream that is already in progress, i.e. the previous bytes in the bitstream are not known, the decoder can scan the bitstream until a synchronization command packet is found. The bytes immediately following the packet's first byte are a specific pattern of bytes that are unlikely to randomly occur in the bitstream. When the decoder finds a synchronization command packet byte followed by the correct byte pattern the decoder has found a synchronization command packet and can start decoding the contents of the bitstream. The synchronization command packet may also contain information that is not unique to a specific program to decode, such as sample rate, and priming information such as the need to prime audio decoding at the start of the stream.

One or more program command packets 184(A, B) can follow a synchronization command packet 182(A, B). A program command packet 184(A, B) defines information about a particular program to decode. For example, if a single, encoded bitstream 16 includes two available programs: one for English and one for Spanish, there could be two program command packets, one for each language. A program command packet 184(A, B) can contain a unique integer program ID that can be used to refer to that program in the bitstream 16. A program command packet 184(A, B) specifies which channels to decode for channel related packet types. For example, a program command packet 184(A, B) can use channel bitmasks of the desired channels to decode, e.g. 32 bits to represent 32 possible channels for a particular channel packet type. Each set bit in a channel bitmask can indicate that the associated channel should be decoded, while a clear bit in the channel bitmask can indicate that the associated channel should be skipped. A program command packet 184(A, B) may also contain optional properties for additional information, such as language localization information, and is able to later add new properties while remaining backward compatible.

End of stream command packet 188 terminates single encoded bitstream 16. This packet 188 signifies that there is no remaining data in the bitstream for the decoder 18 to decode. The end of stream command packet 188 may also include information about the end of the stream which may be used by the decoder 18 to finish the decoding process.

Audio related channel packet types such as the Single Channel, Low-Frequency, Dialogue Channel, Channel Pair and Motion Channel types shown in Table 4 primarily contain encoded audio data. The Data Channel packet can hold any type of data, but is more typically used for other forms of channel selectable data, such as subtitles, lyrics, album art, custom studio data, etc. It can be useful to relate the contents of a channel packet to a fixed duration of time. For example, ideally if each packet of a channel contained the state of that channel for exactly one second of time then it can be easy to relate the content of each channel to an overall timeline, e.g., the first packet is the first second of content, the second packet is the second second of content, the third packet is the third second of content, etc. As an example embodiment we'll choose a duration time based on the count of audio samples at a given sample rate, and refer to that count of samples as an Audio Block. Table 4 shows example sample counts to use for audio blocks along with the duration of time represented by those samples at a given sample rate. Note that the audio block sample counts were chosen to be power two values that result in roughly a tenth of a second per audio block. Other sample counts could have been used, including non-power two lengths, but in general given the inherent mathematics and latencies of the MDCT calculations a reasonable approach is to use the largest supported MDCT block length of a sample rate as the audio block length for that sample rate.

TABLE 4

| Sample Rate | Sample Count per Audio Block | Approximate Length in Seconds |
| --- | --- | --- |
| 44.1 kHz | 4096 | 0.093 |
| 48 kHz | 4096 | 0.085 |
| 88.2 kHz | 8192 | 0.093 |
| 96 kHz | 8192 | 0.085 |

As described in this specification, unless specified otherwise, the length of an audio block refers to the count of samples. In an embodiment the encoder 12 and the decoder 18 could conceptually work in units of audio blocks. For example, the encoder 12 could consume input data one audio block at a time and the decoder could output decoded data one audio block at a time. All audio blocks in the stream would conceptually be the same length of time and therefore the same count of samples, with some notable exceptions such as the end of the stream or when audio channels start or stop, in which case the audio block still represents the same fixed length of time, but there may be incomplete data, e.g. fewer samples for a channel or channels.

Typically, audio samples are encoded into audio packets the same way regardless of audio packet type, with a notable exception being the Channel Pair packet type which has two related channels encoded together, e.g. Left and Right channels. Audio samples are typically encoded by the subband coder 54, and the difference between the original samples and the results of decoding the subband encoded data is used as an error signal that is then encoded by the MDCT coder 62. In that case typically both the subband coder's encoded data and the transform coder's encoded data are stored in the same audio packet, although sometimes some or all of the bands of the subband coder 54 can be omitted. In essence an audio packet can be considered to have an encoded version of a range of audio samples represented as a combination of the subband coder's encoded band values and the transform coder's encoded MDCT data. The combination of the encoded data is what the audio decoder 18B will use to decode and regenerate those audio samples. Ideally the count of encoded audio samples in a single packet would match the sample count defined as an audio block such that the audio decoder 18B decoding a packet would decode an audio block length worth of samples; however, due to the overlapping nature of the MDCT data as well as the differing MDCT block sizes that may have been used the set of samples in a single packet may extend into the samples that conceptually belong to the next audio block. Similarly, samples that conceptually belong to the current packet may have already been transmitted via the previous audio packet.

Figure 15:
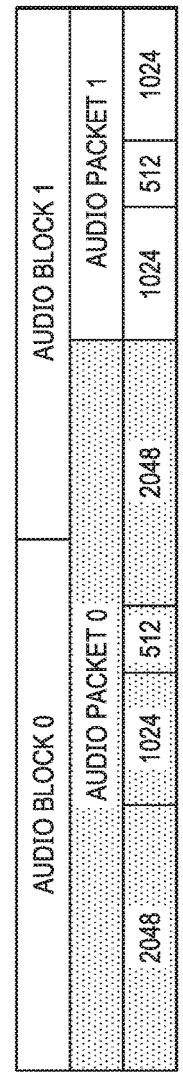
FIG. 15 is a diagram depicting how an audio packet's decodable sample data may not align with a fixed interval of time, in accordance with certain example embodiments.

FIG. 15 depicts a simplified example to help visualize two audio packets, one for audio block 0 and one for audio block 1, where the packet representing audio block 0 contains encoded sample data that extends into audio block 1. In the example depicted, the last 2048 decodable samples from packet 0 not only contain the final 512 samples of audio block 0, but also extend into the starting 1536 samples that conceptually represent audio block 1 (512+1536=2048). If an embodiment uses this notion of an audio block to establish an overall fixed duration then another way one could describe the relationship between a packet and an audio block is that once a packet of an associated audio block has been decoded, the decoder 18 should have at least an audio block worth of content that can be outputted.

For both MDCT decoding and subband decoding, there is an initial startup situation where the subband decoder 254 and the MDCT decoder 256 need to decode data that doesn't immediately translate into decoded audio samples. That data is stored as primer information in that it is priming the decoders without actually fully decoding any audio samples. This information is found in the first audio packet of a channel that is starting up, such as at the start of a stream. After the initial primer information has been decoded, all future MDCT and subband decoding will result in samples being fully decoded.

Data channel packets are designed to hold various types of data in a backward compatible and extensible format, and so the content of a data packet is not necessarily directly related to audio samples; however, it can be useful in some embodiments for data packets to be related to a standard duration of time, such as the audio block concept. In such an embodiment, a single data packet for a single data channel can optionally exist for each audio block worth of time in the stream. This implicit duration could be useful for establishing a base timeline for interpreting some of the content found in a data packet, such as subtitles that should be displayed at appropriate times in the stream. It should be noted, however, that since data channel packets are extremely flexible at representing any type of data an embodiment could add timing information at any resolution to a data packet to be interpreted as desired.

The different audio related channel types can optionally have spatial information that can identify things such as an audio emitter's position in space, or the position of a speaker, or even the characteristics of an environment. The spatial information can be static vs. dynamic and the representation of the spatial information can vary. Static, i.e. non-moving, spatial information is typically representable by less data and less frequently than is required to represent dynamic spatial information of something moving with respect to time. For example, static information would typically only need to be included in the bitstream at a synchronization point such that a decoder starting up at the synchronization point can know the spatial information of the static things. Dynamic spatial information by its very nature of being changing with respect to time will need to have spatial information that can be queried at some resolution of time. If an embodiment uses a concept of audio blocks to represent a duration of time then it may be convenient to split up the representation of dynamic spatial information to make that information relative to audio blocks similarly to how samples are relative to audio blocks, however this is not a requirement, and may even be disadvantageous given the type or desired resolution of dynamic spatial information. As a generality if dynamic spatial information for audio samples must be decoded in order to fully decode/render the audio samples then the overall latency of the encoder 12 and the decoder 18 will be affected by the encoding and decoding of both sets of data. In practice this just means that both samples and dynamic spatial information need to be divided up at a rate of time that satisfies the desired encode and decode latency requirements of the application. Static spatial information could be included inside of a packet at or soon after a synchronization command packet. Dynamic spatial information could also be included at or soon after a synchronization command packet, but would typically have additional information encoded in other packets later in the stream. The representation of spatial information can vary depending on needs. For example, a single angle around a unit circle relative to a flat ground plane could be sufficient for many needs, such as the location of an object emitting audio where the distance to the object from the observer and the relative difference in height between the object and the observer are not important. In such an example the spatial information required could potentially be as simple as a single byte (8 bits) where the range of a byte [0, 256) could be linearly mapped to an angle around a unit circle [0, 360) degrees with the observer at the center providing an accuracy of approximately 1.4 degrees, which could be sufficient for many applications. If a relative height was important then the addition of 7 bits (−64, 64] mapped to a tilt angle of [−90, 90) degrees would supply the same resolution of 1.4 degrees but in a vertical direction. These example numbers are assuming the desire was to have a fixed unit of resolution where any angle is given the same precision of any other angle. In practice non-linear representations can be used to supply more precision for more important things. As an example, if one was to include the distance to an object along with the previously described angles that distance could be represented as a non-linear curve where there is a much greater precision when the object is up close to the observer versus when the object is further away. Another example is the position of actors on a stage or in a movie, where apart from rare exceptions all dialogue appears to be coming from in front of the observer and within a relatively narrow range of distances. Such a case could devote all or nearly all bits to a fairly restricted slice of space compared to the total space around the observer. For dynamic spatial information the information is temporal so can leverage delta changes in position/orientation over time, which for perceptually slow moving objects with respect to the observer can be dramatically smaller values on average than the equivalent absolute positions/orientations in space. Also, in practice moving objects frequently have long periods of only minor changes in acceleration, which can be encoded into a small number of bits, such as using splines with linear or non-linear keys to approximate the movement.

Environmental characteristics data 14E, such as the effects of reverb, can be encoded into the bitstream to represent the audio characteristics of different types of environments, e.g., the inside of a submarine has very different characteristics than the inside of a concert hall. The environmental characteristics are also a spatial representation, which can give the listener perceptual clues about many things, such as the size, shape, distance, directionality and texture/composition of the environment, as well as clues about objects within the environment. Different environments are specified through a collection of values defining the parameters of that environment. The amount and type of parameters needed can vary greatly based on the type of environment that is being simulated, with some types of environments requiring very little information to simulate and others requiring much more extensive information. An embodiment of the codec can allow the selecting of predefined basic types of environments that can be customized to represent a wide range of environments and environmental effects. Providing these tunable basic environment types and reasonable default parameter values allows the associated environmental data to be encoded efficiently into the bitstream since only a minimum of data needed to support a particular type of environment has to be encoded. New basic environment types can be added later with the bitstream remaining backward compatible with older existing basic environment types using properties (previously discussed) and other similar extensions. An embodiment is not limited to predefined basic environment types, and can create custom environmental effects through other means, such as but not limited to using properties in Data Channel packets to describe entirely new information or to extend upon existing information found in the stream. In an embodiment environmental information, as with other types of spatial information, would typically be included inside of a packet at or soon after a synchronization command packet, allowing a decoder that is starting decoding from a synchronization point in the bitstream to decode environmental information so that audio samples affected by it can be rendered appropriately. Also, similar to other types of spatial information, changes to the environment can be encoded into later packets in the bitstream as appropriate to simulate a change in environment, such as a camera cut in a movie. It is also possible, albeit normally not desirable, to decode audio samples without having decoded the environmental data that affects those samples. In such a case the initial audio samples can be treated as being in a "dry" environment with minimal, default, or otherwise absent environment effects, and the audio will transition later into the actual environmental effects when environmental data is found in the bitstream and decoded. This technique can be useful in reducing the overall redundancy of environmental information in the bitstream, such as not specifying all environmental information at every synchronization point.

Figure 16:
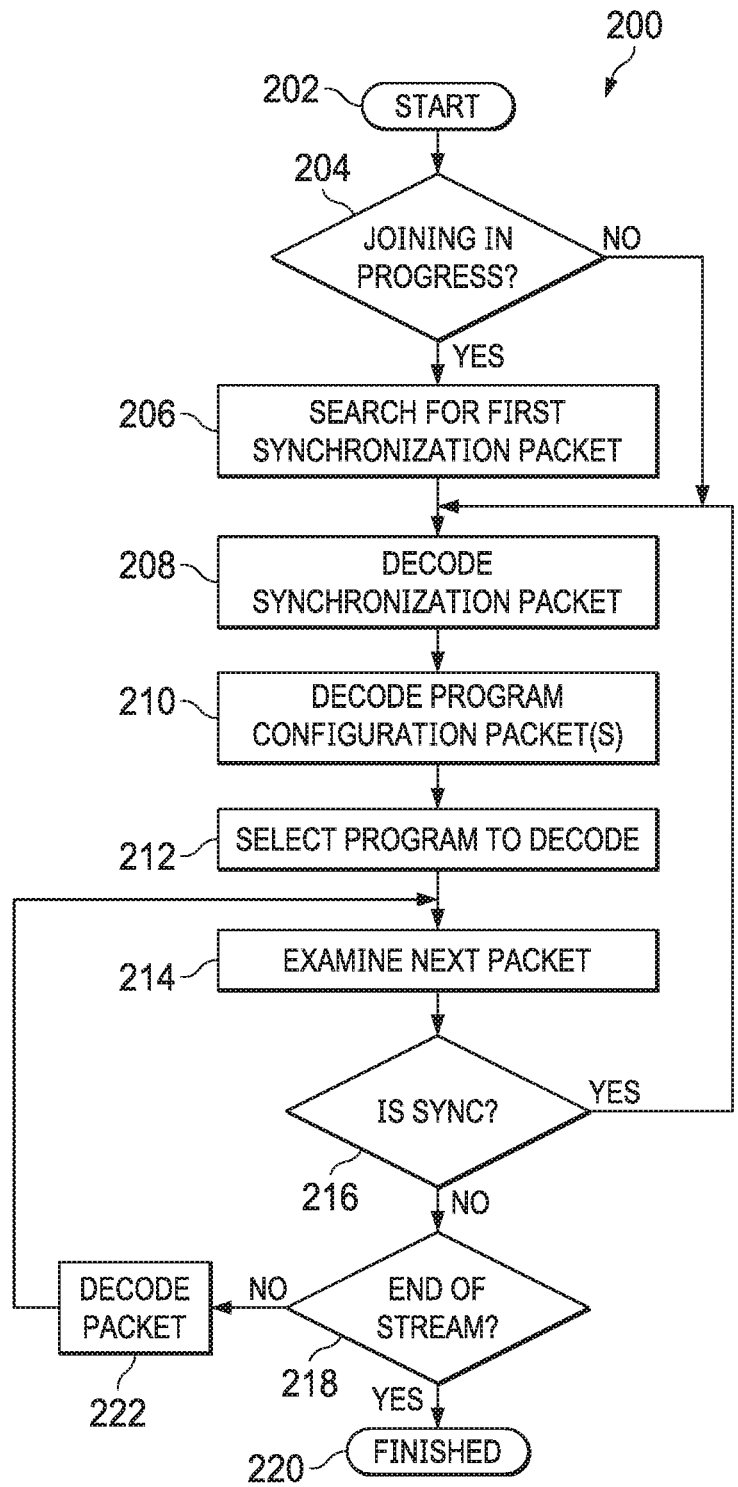
FIG. 16 is an algorithm depicting decoder algorithmic logic flow, in accordance with certain example embodiments.

FIG. 16 depicts an algorithm flow chart for a decoder 18 in accordance with certain example embodiments. The decoder 18 will decode a bitstream and return approximations or in some cases exact reproductions of the original signals that were input to the encoder 12. The decoder algorithm flow may start upon, e.g., device activation or an application using the codec being activated, block 202. Upon initiation, the decoder algorithm determines if a bitstream being joined is currently in progress or not, block 204. If joining a bitstream in progress where earlier data in the bitstream is not known, the decoder algorithm 200 can search for a synchronization command packet, block 206, at which point decoding can begin. If it is determined that the bitstream being joined is beginning, i.e. the first packet is the synchronization packet, the synchronization command packet in the bitstream is decoded, block 208. The synchronization command packet contains information global to the data that follows, regardless of the program that will be decoded. For example, the synchronization command packet can specify the sample rate if the sample rate did not differ between programs. Following the synchronization command packet are one or more program configuration packets that are decoded, block 210. The other command packets may be intermixed with the program configuration packets even though omitted from the diagram. Effectively, the stage after finding a synchronization command packet is to find the information about the programs in the stream such that an appropriate program to decode can be selected. The decoder algorithm 200 can then start examining other packets in the stream and take action on each packet, block 214. Packets with channels associated with the desired program to decode are decoded, while packets that are not relevant to the desired program are skipped. If a synchronization command packet is found, then the logic flows back to handling the synchronization command packet, block 208. If an end of stream command packet is found, as determined in block 218, then there are no more packets to decode and the decoder can finalize the decoding process and signal that the decoding of the bitstream has finished, block 220. If the end of stream command is not found, as determined in block 218, the next packet is decoded, block 222, and the algorithm 200 then returns to examine the next packet 214.

In most cases there is enough information following a synchronization point in the bitstream 16 to begin decoding the contents of the bitstream from that point onward without requiring previous knowledge about the bitstream. This allows a decoder 18 to be able to join a bitstream that is already in progress and begin decoding after a synchronization point has been found. It also allows the ability to seek to a different point in the bitstream and resume decoding once a synchronization point has been found. It also allows multiple bitstreams to be easily spliced together, such as the insertion of a commercial into radio content, where the content of the original source bitstreams can be very different without interdependencies between them. This does mean that some information, such as program information, can redundantly exist in the stream following synchronization points even if that information has not changed since the previous synchronization point. For some non-critical information this redundancy may be undesirable or unnecessary, in which case that non-critical information could be broken up and/or repeated less frequently. As an example, album artwork might require a lot of bits to represent in its entirety. Redundantly embedding the album artwork after each synchronization point could result in a very large increase in the size of the bitstream. To reduce the impact of the redundant data the album artwork could be broken up and only a portion of the overall data can be stored after each synchronization point. A player capable of displaying album artwork could wait until all pieces were decoded before actually displaying the complete image. The end result being that the entire album artwork data would not be immediately available after a synchronization point, but the impact of having the redundant artwork data in the bitstream will have been reduced. Another concern is the priming needed by the decoder 18 to decode some types of data, such as MDCT data. An audio sample is encoded by two MDCTs, so conversely two MDCTs must be decoded in order to fully decode an audio sample. At the start of a stream, or when a new channel starts, there is additional primer information in the bitstream to handle this case. That primer information could be included after each synchronization point; however, a less expensive solution is simply to discard the resulting decoding samples from the first MDCT, afterwhich the transform decoder has been primed such that each new MDCT will result in validly decoded audio samples.

As previously described, a program configuration can be represented by an information in a program configuration command packet. That packet comprises a program ID used to identify a particular program as well as which channels to decode for that program. The application running the decoder 18 can select a program ID for the desired program to decode. The program ID of the program to decode can be set any time before the first channel related packet is to be decoded, including in some embodiments from a callback or another type of signaling that can be done by the decoder when programming information from program command packets has been found in the bitstream. In such a case the controlling application could then inspect information about the programs that are available in the bitstream and choose the desired program to decode.

Figure 17:
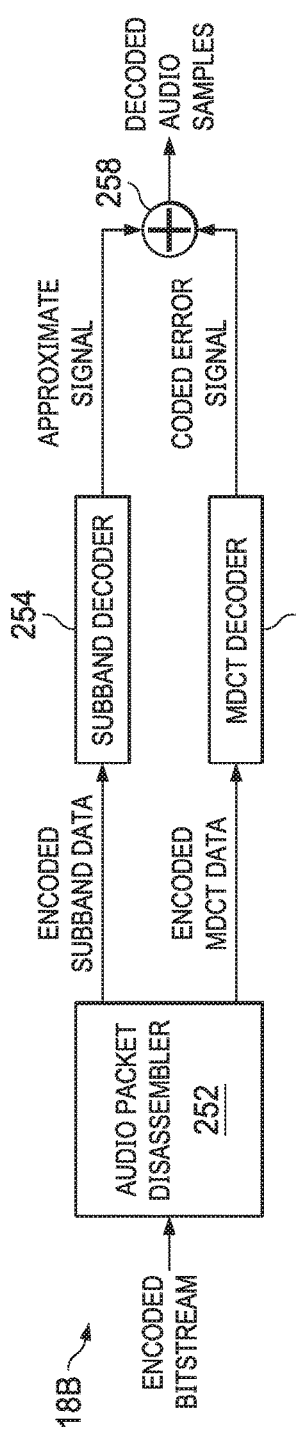
FIG. 17 is a block diagram depicting the reconstructing of audio samples from encoded audio sample data, in accordance with certain example embodiments.

FIG. 17 depicts a block diagram of audio decoder 18B in accordance with certain embodiments. The audio decoder 18 comprises an audio packet disassembler 252, a subband decoder 254, a MDCT decoder 256, and an adder 258 wherein the audio packet disassembler 252 identify data type and dispatch encoded subband data to the subband decoder 254, and encoded MDCT data to the MDCT decoder 256. The subband decoder 254 can decode the encoded subband data and generate approximate signal, which will be discussed in detail in FIG. 18. The MDCT decoder 256 can decode the encoded MDCT data and output coded error signal, as shown below in FIG. 20. The outputs of subband decoder 254 and MDCT decoder 256 are then added together to get decoded audio samples.

Figure 18:
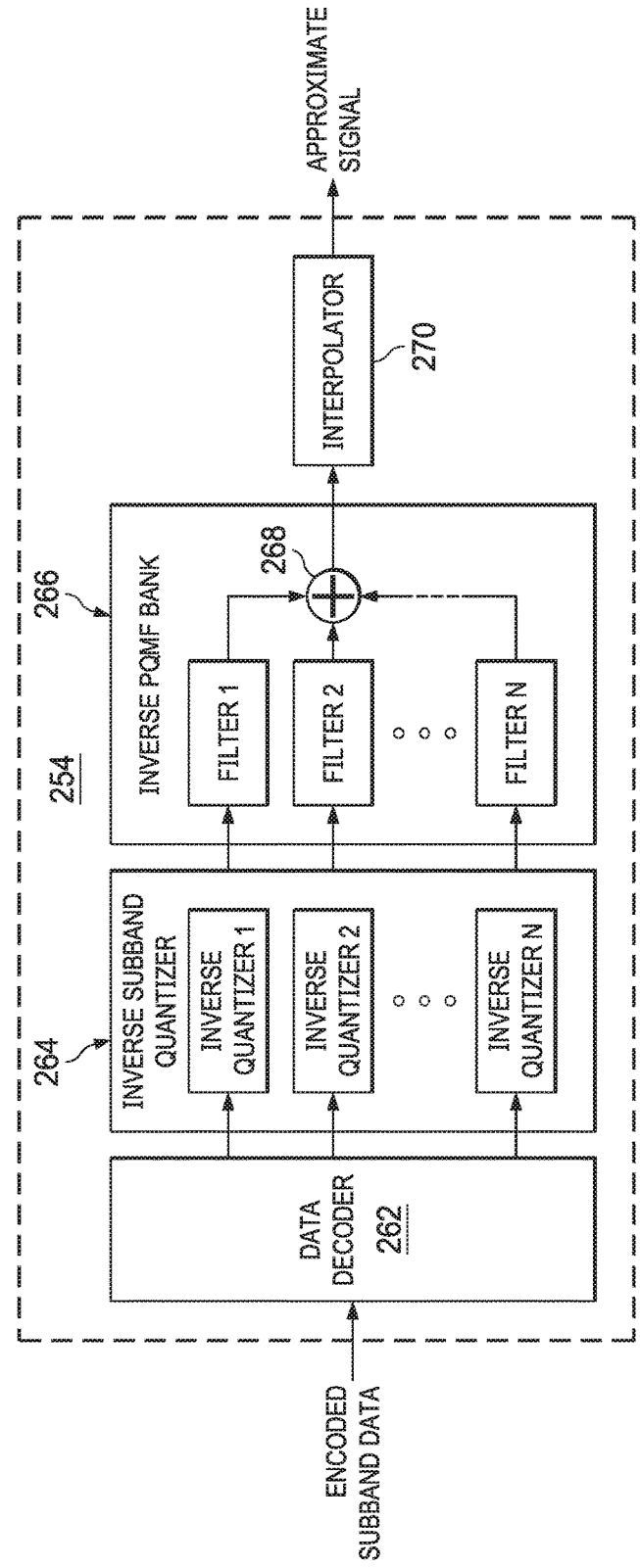
FIG. 18 is a block diagram depicting a subband decoder for decoding encoded subband data, in accordance with certain example embodiments.

FIG. 18 depicts a block diagram of subband decoder 254 for decoding encoded subband data input in accordance with certain example embodiments. Subband decoder 254 comprises a data decoder 262, an inverse subband quantizer 264, an inverse PQMF bank 266, an adder 268 and an interpolator 270. In essence, the subband decoder 254 decodes the input data, inverse quantizes the decoded signal and generates approximate signal. The data decoder 262 may use Huffman decoding or Arithmetic decoding. The inverse subband quantizer can be using inverse APCM (IAPCM) or inverse ADPCM (IADPCM) system. For higher sampling rates, e.g. 88.2 kHz and 96 kHz, the audio samples can be passed through an interpolator 270. Although, for some sampling rates the interpolator may not be necessary. It should be understood that subband decoder 72 in FIG. 3 is employing the same decoding function as subband decoder 254.

Figure 19:
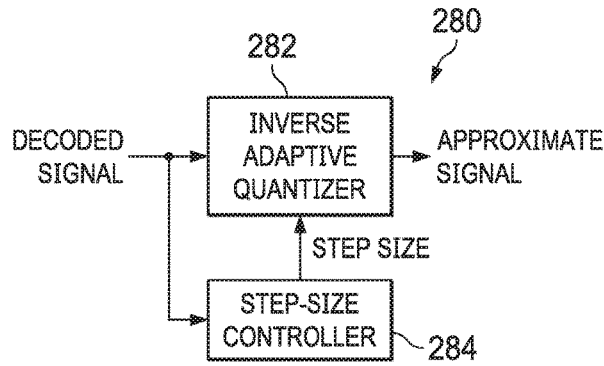
FIG. 19 is a block diagram depicting a subband decoder inverse APCM, in accordance with certain example embodiments.

FIG. 19 depicts a block diagram of an inverse APCM quantizer, in accordance with certain example embodiments, denoted generally as 280. The inverse APCM quantizer 280 includes an inverse adaptive quantizer 282 and a step-size controller 284. It should be understood that employing an inverse APCM quantizer is an example of the implementation of the inverse subband quantizer 264, which optionally may employ an inverse ADPCM quantizer, depending on what the subband quantizer 78 is employing. The inverse adaptive quantizer 282 generates an approximate signal based on the decoded signal (quantized signal) from data decoder 262 and the current step size value set by the step-size controller 284. More detail information about step-size controller 284 can be referred back to FIG. 5. If the subband quantizer 78 in FIG. 3 alternatively employs an ADPCM quantizer, here the inverse ADPCM quantizer should be correspondingly employed, where a predictor may be used to receive output from the inverse adaptive quantizer and output approximate signal.

Figure 20:
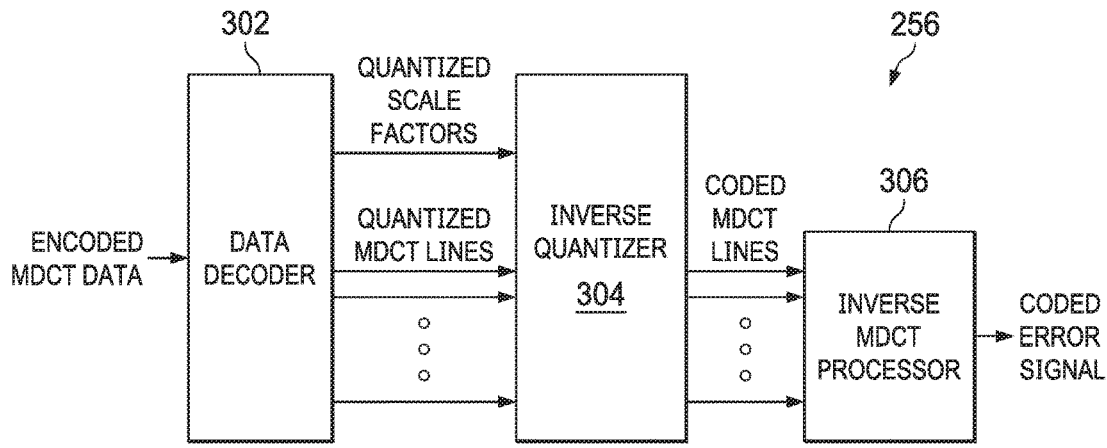
FIG. 20 is a block diagram depicting a MDCT decoder, in accordance with certain example embodiments.

FIG. 20 depicts a block diagram of a MDCT decoder, in accordance with certain example embodiments, denoted generally as 256. The MDCT decoder 256 comprises a data decoder 302, an inverse quantizer 304, and an inverse MDCT processor 306. The data decoder 302 can use lossless decoding, such as Huffman decoding or Arithmetic decoding, to decode the encoded MDCT data, where the decoded MDCT data includes the quantized MDCT line values, and quantized scale factor values. The quantized MDCT line values are then computed by the inverse quantizer 304 by scaling the Q values by the associated scale factor values. The coded MDCT line values are then processed through an inverse MDCT processor 306 to regenerate the coded error signal. The coded error signal is then added with the approximate signal from the subband decoder 254 to the final decoded audio samples that will be returned to the user.

Figure 21:
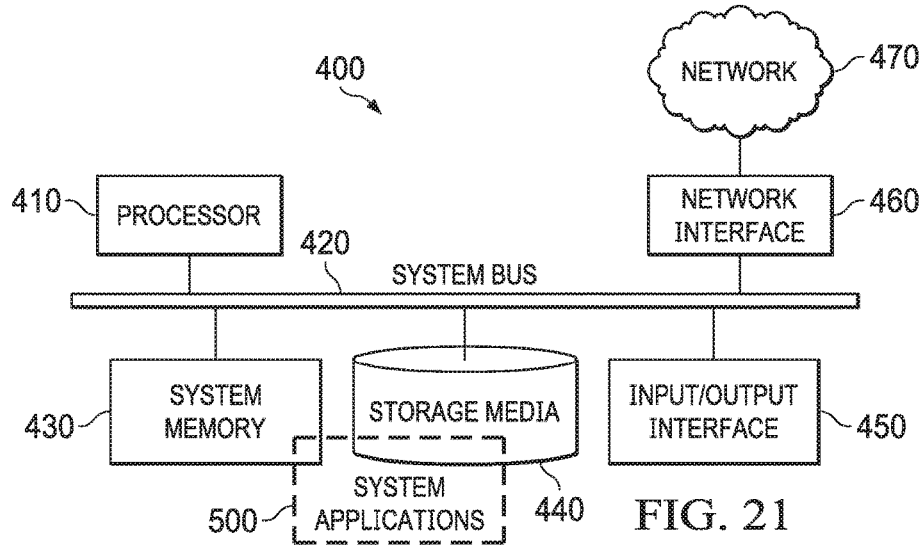
FIG. 21 is a block diagram depicting a computing machine and system applications, in accordance with certain example embodiments.

FIG. 21 depicts a computing machine 400 and a system applications module 500 in accordance with example embodiments. The computing machine 400 can correspond to any of the various computers, mobile devices, laptop computers, servers, embedded systems, or computing systems presented herein. The module 500 can comprise one or more hardware or software elements designed to facilitate the computing machine 400 in performing the various methods and processing functions presented herein. The computing machine 400 can include various internal or attached components such as a processor 410, system bus 420, system memory 430, storage media 440, input/output interface 450, and a network interface 460 for communicating with a network 470.

The computing machine 400 can be implemented as a conventional computer system, an embedded controller, a laptop, a server, a mobile device, a smartphone, a wearable computer, a customized machine, any other hardware platform, or any combination or multiplicity thereof. The computing machine 400 can be a distributed system configured to function using multiple computing machines interconnected via a data network or bus system.

The processor 410 can be designed to execute code instructions in order to perform the operations and functionality described herein, manage request flow and address mappings, and to perform calculations and generate commands. The processor 410 can be configured to monitor and control the operation of the components in the computing machine 400. The processor 410 can be a general purpose processor, a processor corer, a multiprocessor, a reconfigurable processor, a microcontroller, a digital signal processor ("DSP"), an application specific integrated circuit ("ASIC"), a controller, a state machine, gated logic, discrete hardware components, any other processing unit, or any combination or multiplicity thereof. The processor 410 can be a single processing unit, multiple processing units, a single processing core, multiple processing cores, special purpose processing cores, co-processors, or any combination thereof. According to certain embodiments, the processor 410 along with other components of the computing machine 400 can be a virtualized computing machine executing within one or more other computing machines.

The system memory 430 can include non-volatile memories such as read-only memory ("ROM"), programmable read-only memory ("PROM"), erasable programmable read-only memory ("EPROM"), flash memory, or any other device capable of storing program instructions or data with or without applied power. The system memory 430 can also include volatile memories such as random access memory ("RAM"), static random access memory ("SRAM"), dynamic random access memory ("DRAM"), and synchronous dynamic random access memory ("SDRAM"). Other types of RAM also can be used to implement the system memory 430. The system memory 430 can be implemented using a single memory module or multiple memory modules. While the system memory 430 is depicted as being part of the computing machine 400, one skilled in the art will recognize that the system memory 430 can be separate from the computing machine 400 without departing from the scope of the subject technology. It should also be appreciated that the system memory 430 can include, or operate in conjunction with, a non-volatile storage device such as the storage media 440.

The storage media 440 can include a hard disk, a floppy disk, a compact disc read-only memory ("CD-ROM"), a digital versatile disc ("DVD"), a Blu-ray disc, a magnetic tape, a flash memory, other non-volatile memory device, a solid state drive ("SSD"), any magnetic storage device, any optical storage device, any electrical storage device, any semiconductor storage device, any physical-based storage device, any other data storage device, or any combination or multiplicity thereof. The storage media 440 can store one or more operating systems, application programs and program modules such as module 2050, data, or any other information. The storage media 440 can be part of, or connected to, the computing machine 400. The storage media 440 can also be part of one or more other computing machines that are in communication with the computing machine 400 such as servers, database servers, cloud storage, network attached storage, and so forth.

The system applications module 500 can comprise one or more hardware or software elements configured to facilitate the computing machine 400 with performing the various methods and processing functions presented herein. The module 500 can include one or more sequences of instructions stored as software or firmware in association with the system memory 430, the storage media 440, or both. The storage media 440 can therefore represent examples of machine or computer readable media on which instructions or code can be stored for execution by the processor 410. Machine or computer readable media can generally refer to any medium or media used to provide instructions to the processor 410. Such machine or computer readable media associated with the module 500 can comprise a computer software product. It should be appreciated that a computer software product comprising the module 500 can also be associated with one or more processes or methods for delivering the module 500 to the computing machine 400 via the network 470, any signal-bearing medium, or any other communication or delivery technology. The module 500 can also comprise hardware circuits or information for configuring hardware circuits such as microcode or configuration information for an FPGA or other PLD.

The input/output ("I/O") interface 450 can be configured to couple to one or more external devices, to receive data from the one or more external devices, and to send data to the one or more external devices. Such external devices along with the various internal devices can also be known as peripheral devices. The I/O interface 450 can include both electrical and physical connections for coupling the various peripheral devices to the computing machine 400 or the processor 410. The I/O interface 450 can be configured to communicate data, addresses, and control signals between the peripheral devices, the computing machine 400, or the processor 410. The I/O interface 450 can be configured to implement any standard interface, such as small computer system interface ("SCSI"), serial-attached SCSI ("SAS"), fiber channel, peripheral component interconnect ("PCI"), PCI express (PCIe), serial bus, parallel bus, advanced technology attached ("ATA"), serial ATA ("SATA"), universal serial bus ("USB"), Thunderbolt, FireWire, various video buses, and the like. The I/O interface 450 can be configured to implement only one interface or bus technology. Alternatively, the I/O interface 450 can be configured to implement multiple interfaces or bus technologies. The I/O interface 450 can be configured as part of, all of, or to operate in conjunction with, the system bus 420. The I/O interface 450 can include one or more buffers for buffering transmissions between one or more external devices, internal devices, the computing machine 400, or the processor 410.

The I/O interface 450 can couple the computing machine 400 to various input devices including mice, touch-screens, scanners, electronic digitizers, sensors, receivers, touchpads, trackballs, cameras, microphones, keyboards, any other pointing devices, or any combinations thereof. The I/O interface 450 can couple the computing machine 400 to various output devices including video displays, speakers, printers, projectors, tactile feedback devices, automation control, robotic components, actuators, motors, fans, solenoids, valves, pumps, transmitters, signal emitters, lights, and so forth.

The computing machine 400 can operate in a networked environment using logical connections through the network interface 460 to one or more other systems or computing machines across the network 470. The network 470 can include wide area networks (WAN), local area networks (LAN), intranets, the Internet, wireless access networks, wired networks, mobile networks, telephone networks, optical networks, or combinations thereof. The network 470 can be packet switched, circuit switched, of any topology, and can use any communication protocol. Communication links within the network 470 can involve various digital or an analog communication media such as fiber optic cables, free-space optics, waveguides, electrical conductors, wireless links, antennas, radio-frequency communications, and so forth.

The processor 410 can be connected to the other elements of the computing machine 400 or the various peripherals discussed herein through the system bus 420. It should be appreciated that the system bus 420 can be within the processor 410, outside the processor 410, or both. According to some embodiments, any of the processor 410, the other elements of the computing machine 400, or the various peripherals discussed herein can be integrated into a single device such as a system on chip ("SOC"), system on package ("SOP"), or ASIC device.

Embodiments may comprise a computer program that embodies the functions described and illustrated herein, wherein the computer program is implemented in a computer system that comprises instructions stored in a machine-readable medium and a processor that executes the instructions. However, it should be apparent that there could be many different ways of implementing embodiments in computer programming, and the embodiments should not be construed as limited to any one set of computer program instructions. Further, a skilled programmer can be able to write such a computer program to implement an embodiment of the disclosed embodiments based on the appended flow charts, algorithms and associated description in the application text. Therefore, disclosure of a particular set of program code instructions is not considered necessary for an adequate understanding of how to make and use embodiments. Further, those skilled in the art will appreciate that one or more aspects of embodiments described herein may be performed by hardware, software, or a combination thereof, as may be embodied in one or more computing systems. Moreover, any reference to an act being performed by a computer should not be construed as being performed by a single computer as more than one computer may perform the act.

The example embodiments described herein can be used with computer hardware and software that perform the methods and processing functions described previously. The systems, methods, and procedures described herein can be embodied in a programmable computer, computer-executable software, or digital circuitry. The software can be stored on computer-readable media. For example, computer-readable media can include a floppy disk, RAM, ROM, hard disk, removable media, flash memory, memory stick, optical media, magneto-optical media, CD-ROM, etc. Digital circuitry can include integrated circuits, gate arrays, building block logic, field programmable gate arrays (FPGA), etc.

The example systems, methods, and acts described in the embodiments presented previously are illustrative, and, in alternative embodiments, certain acts can be performed in a different order, in parallel with one another, omitted entirely, and/or combined between different example embodiments, and/or certain additional acts can be performed, without departing from the scope and spirit of various embodiments. Accordingly, such alternative embodiments are included in the description herein.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

Although specific embodiments have been described above in detail, the description is merely for purposes of illustration. It should be appreciated, therefore, that many aspects described above are not intended as required or essential elements unless explicitly stated otherwise. Modifications of, and equivalent components or acts corresponding to, the disclosed aspects of the example embodiments, in addition to those described above, can be made by a person of ordinary skill in the art, having the benefit of the present disclosure, without departing from the spirit and scope of embodiments defined in the following claims, the scope of which is to be accorded the broadest interpretation so as to encompass such modifications and equivalent structures.

What is claimed is:

1. A codec for processing audio data comprising:
   a computer-usable non-transitory storage resource; and
   a processor communicatively coupled to the storage resource, wherein the processor executes application code instructions that are stored in the storage resource to cause the codec to:
   receive an audio, audio auxiliary, program configuration, and data signals from a program source, the audio signals including single channel audio and multi-channel audio signals, audio auxiliary signals including spatial and motion data and environmental characteristics, the data signals including program related data; and
   generate an encoded bitstream, wherein the bitstream includes a synchronization command data, zero or more of a program command data, audio channel data, audio auxiliary data, program content data, and an end of stream data, wherein the encoded bitstream includes an identifier for defining packet type for each data component;
   wherein the synchronization command data includes a stream start flag defining an entry point for decoding the bitstream and information at first sample location within a block, and further provides sample rate for the encoded bitstream.

2. The codec for processing audio data according to claim 1 wherein the audio auxiliary data includes spatial audio information and environmental characteristics and effects.

3. The codec for processing audio data according to claim 1 wherein the application code instructions that generate the encoded bitstream further includes application code instructions to cause the codec to:
   filter sampled audio signals into a plurality of frequency band components;
   generate quantized digital components for each band of the plurality of bands by adaptive pulse code modulating the frequency band components;
   identify a potential for pre-echo events for at least one band exceeding threshold within the generated quantized digital components;
   generate an approximate signal of the filtered audio samples by decoding zero or more quantized digital components using inverse adaptive pulse code modulation;
   generate an error signal by comparing the approximate signal with the sampled audio signal; and
   process the error signal and quantized digital components.

4. The codec for processing audio data of claim 3 wherein the application code instructions that process the error signal and quantized digital components further comprises application code instruction that cause the codec to:
   process delayed audio signals and Q band values;
   determine the potential for pre-echo events from the Q band values; and
   determine scale factors and Modified Discrete Cosine Transform (MDCT) block sizes.

5. The codec for processing audio data of claim 4 wherein the application code instructions further comprises application code instruction that causes the encoder to:
   determine if an absolute Q band value exceeds a predetermined threshold value;
   determine the MDCT block sizes based on the magnitude of a Q band value and the band that contained the Q band value; and
   determine scale factors based on the MDCT block sizes and the delayed audio signals.

6. The codec for processing audio data of claim 4 wherein the application code instructions that process the error signal and quantized digital components further comprises application code that cause the codec to:
   transform, using Modified Discrete Cosine Transform (MDCT), the error signal into higher resolution frequency components using an MDCT of the previously determined block sizes;
   quantize the scale factors and frequency components; and
   encode the quantized frequency components, block sizes, and quantized scale factors for inclusion in the bitstream.

7. The codec for processing audio data of claim 3 wherein the application code instruction that filter sampled audio signals, generate quantized digital components, and identify pre-echo events from the generated quantized digital components further comprises application code instructions to cause the codec to:
   filter the audio samples into a plurality of frequency band components using at least one Pseudo-Quadrature Mirror Filter (PQMF);
   modulate the plurality of frequency band components into a plurality of quantized band values using an adaptive pulse code modulation technique; and
   decode the plurality of quantized band values into an approximate signal using an inverse adaptive pulse code modulation technique and at least one Inverse Pseudo-Quadrature Mirror Filter (IPQMF).

8. A non-transitory computer readable storage medium comprising a set of computer instructions executable by a processor for instructing a computer to encode and decode audio data, the computer instructions configured to:
   receive an audio, audio auxiliary, program configuration, and data signals from a program source, the audio signals including single channel audio and multi-channel audio signals, audio auxiliary signals including spatial and motion data and environmental characteristics, the data signals including program related data; and
   generate an encoded bitstream, wherein the bitstream includes a synchronization command data, zero or more of a program command data, audio channel data, audio auxiliary data, program content data, and an end of stream data, wherein the encoded bitstream includes an identifier for defining packet type for each data component;

wherein the synchronization command data includes a stream start flag defining an entry point for decoding the bitstream and information at first sample location within a block, and further provides sample rate for the encoded bitstream.

9. The non-transitory computer readable storage medium of claim 8 comprising a set of computer instructions executable by a processor for instructing a computer to encode and decode audio data, the computer instructions configured to:
receive the encoded bitstream that includes bitstream synchronization command data and program command data;
process the encoded bitstream and identify within the bitstream the synchronization command data; and
decode the program command packet and at least one program related channel data using information provided in the synchronization command data and decode program related channel data using information provided in the program command data.

10. The non-transitory computer readable storage medium of claim 9 comprising a set of computer instructions executable by a processor for instructing a computer to encode and decode audio data, the computer instructions configured to:
receive encoded quantized bands and encoded Modified Discrete Cosine Transform (MDCT) data; and
decode the received encoded quantized bands and encoded MDCT data.

11. The non-transitory computer readable storage medium of claim 10 comprising a set of computer instructions executable by a processor for instructing a computer to encode and decode audio data, the computer instructions configured to:
decode the MDCT data; and
inverse modified discrete cosine transform line values from the decoded MDCT data to generate a coded error signal;
wherein the coded error signal was generated by an encoder.

12. The non-transitory computer readable storage medium of claim 11 comprising a set of computer instructions executable by a processor for instructing a computer to decode audio data, the computer instructions configured to:
inverse adaptive pulse code modulate individual quantized bands;
inverse pseudo quadrature mirror filter each inverse modulated band; and
add each inverse mirror filtered band together to generate an approximate signal.

13. The non-transitory computer readable storage medium of claim 12 comprising a set of computer instructions executable by a processor for instructing a computer to decode audio data, the computer instructions configured to cause the decoder to add the approximate signal and error signal together.

14. A computer-aided method of encoding and decoding audio data, the method comprising:
receiving an audio, audio auxiliary, program configuration, and data signals from a program source, the audio signals including signal channel audio and multi-channel audio signals, audio auxiliary signals including spatial and motion data and environmental characteristics, the data signals including program related data; and
generating an encoded bitstream, wherein the bitstream includes a synchronization command data, zero or more of a program command data, audio channel data, audio auxiliary data, program content data, and an end of stream data, wherein the encoded bitstream includes an identifier for defining packet type for each data component;
wherein the synchronization command data includes a stream start flag defining an entry point for decoding the bitstream and information at first sample location within a block, and further provides sample rate for the encoded bitstream.

15. The computer-aided method of claim 14 wherein the step of generating further comprising:
filtering sampled audio signals into a plurality of frequency band components;
generating quantized digital components for each band of the plurality of bands by adaptive pulse code modulating the frequency band components;
identifying a potential for pre-echo events for at least one band exceeding threshold within the generated quantized digital components;
generating an approximate signal of the filtered audio samples by decoding zero or more quantized digital components using inverse adaptive pulse code modulation;
generating an error signal by comparing the approximate signal with the sampled audio signal; and
processing the error signal and quantized digital components.

16. The computer-aided method of claim 15 wherein the step of processing the error signal and quantized digital components further comprising:
processing delayed audio signals and Q band values;
determining the potential for pre-echo events from the Q band values; and
determining scale factors and Modified Discrete Cosine Transform (MDCT) block sizes.

17. The computer-aided method of claim 16 further comprising:
determining if an absolute Q band value exceeds a predetermined threshold value;
determining the MDCT block sizes based on a magnitude of a Q band value and a band that contained the Q band value; and
determining scale factors based on the MDCT block sizes and the delayed audio signals.

18. The computer-aided method of claim 16 wherein the step of processing the error further comprising:
transforming, using Modified Discrete Cosine Transform (MDCT) the error signal into higher resolution frequency components using the MDCT block sizes;
quantizing the scale factors and frequency components; and
encoding the quantized frequency components, block sizes and quantized scale factors for inclusion in the bitstream.

19. The computer-aided method of claim 15 wherein the step of filtering sampled audio signals, generating quantized digital components, and identifying pre-echo events from the generated quantized digital components further comprising:

filtering the audio samples into a plurality of frequency band components using at least one Pseudo-Quadrature Mirror Filter (PQMF);

modulating the plurality of frequency band components into a plurality of quantized band values using an adaptive pulse code modulation technique; and decoding the plurality of quantized band values into an approximate signal using an inverse adaptive pulse code modulation technique and at least one Inverse Pseudo-Quadrature Mirror Filter (IPQMF).

20. The computer-aided method of claim 14 further comprising:

receiving the encoded bitstream that includes bitstream synchronization command data and program command data;

processing the encoded bitstream and identify within the bitstream the synchronization command data; and decoding the program command packet and at least one program related channel data using information provided in the synchronization command data and decode program related channel data using information provided in the program command data.

21. The computer-aided method of claim 20 further comprising:

receiving encoded quantized bands and encoded MDCT data; and decoding the received encoded quantized bands and encoded MDCT data;

decoding the MDCT data; and generating a coded error signal by inverse modified discrete cosine transforming line values from the decoded MDCT data to generate a coded error signal;

inverse adaptive pulse code modulating individual quantized bands;

inverse pseudo quadrature mirror filtering each inverse modulated band;

adding each inverse mirror filtered band together to generate an approximate signal; and adding the approximate signal and error signal together;

wherein the coded error signal was generated by an encoder.

* * * * *